United States Patent
Metzmacher et al.

(10) Patent No.: US 9,599,812 B2
(45) Date of Patent: Mar. 21, 2017

(54) FOIL TRAP AND LIGHT SOURCE DEVICE USING SUCH FOIL TRAP

(71) Applicant: USHIO DENKI KABUSHIKI KAISHA, Tokyo (JP)

(72) Inventors: Christof Metzmacher, Aachen (DE); Hermann Giese, Aachen (DE); Achim Weber, Aachen (DE); Hironobu Yabuta, Gotenba (JP); Rolf Theo Anton Apetz, Aachen (DE); Tatsushi Igarashi, Tokyo (JP); Hiroto Sato, Himeji (JP); Noritaka Ashizawa, Yokohama (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/915,845

(22) PCT Filed: Sep. 5, 2014

(86) PCT No.: PCT/JP2014/004571
§ 371 (c)(1),
(2) Date: Mar. 1, 2016

(87) PCT Pub. No.: WO2015/033572
PCT Pub. Date: Mar. 12, 2015

(65) Prior Publication Data
US 2016/0195714 A1    Jul. 7, 2016

(30) Foreign Application Priority Data

Sep. 6, 2013 (JP) ................. 2013-184870

(51) Int. Cl.
*H05G 2/00* (2006.01)
*G02B 27/00* (2006.01)
(Continued)

(52) U.S. Cl.
CPC ..... *G02B 27/0006* (2013.01); *G03F 7/70033* (2013.01); *G03F 7/70916* (2013.01);
(Continued)

(58) Field of Classification Search
None
See application file for complete search history.

(56) References Cited

U.S. PATENT DOCUMENTS

| | | | |
|---|---|---|---|
| 6,359,969 B1 * | 3/2002 | Shmaenok | B82Y 10/00 378/156 |
| 7,247,866 B2 * | 7/2007 | Bakker | B82Y 10/00 250/461.1 |

(Continued)

FOREIGN PATENT DOCUMENTS

| | | | | |
|---|---|---|---|---|
| DE | WO 2009107063 A1 * | 9/2009 | ......... | G03F 7/70808 |
| JP | 2002-504746 A | 2/2002 | | |

(Continued)

OTHER PUBLICATIONS

International Search Report issued in PCT/JP2014/004571; mailed Dec. 9, 2014.

*Primary Examiner* — Andrew Smyth
(74) *Attorney, Agent, or Firm* — Studebaker & Brackett PC

(57) ABSTRACT

Disclosed herein a rotational type foil trap that is capable of avoiding the transmission rate of the EUV light to be lowered even when the EUV light source operates with the high input power and also suppressing the temperature increase of the foil to attain a sufficient life duration. In the rotational type foil trap, one end of each of foils is inserted into each of a plurality of grooves provided on a side face of a center support, and the center support and the each of the foils are fixed together by brazing.

16 Claims, 13 Drawing Sheets

ENLARGED PART B

(51) Int. Cl.
  *G03F 7/20* (2006.01)
  *H05H 1/48* (2006.01)
  *H05H 1/44* (2006.01)

(52) U.S. Cl.
  CPC .............. *H05G 2/008* (2013.01); *H05H 1/44* (2013.01); *H05H 1/48* (2013.01); *H05G 2/001* (2013.01)

(56) References Cited

U.S. PATENT DOCUMENTS

| | | | | |
|---|---|---|---|---|
| 7,427,766 | B2* | 9/2008 | Jonkers | H05G 2/005 250/493.1 |
| 7,737,425 | B2* | 6/2010 | Bakker | B82Y 10/00 250/492.1 |
| 8,129,702 | B2* | 3/2012 | Bakker | B82Y 10/00 250/492.1 |
| 8,736,806 | B2* | 5/2014 | Frijns | G03F 7/70916 355/30 |
| 2004/0160155 | A1* | 8/2004 | Partlo | B82Y 10/00 313/231.31 |
| 2005/0157279 | A1* | 7/2005 | Miyachi | B82Y 10/00 355/30 |
| 2006/0169929 | A1* | 8/2006 | Wassink | G03F 7/70916 250/504 R |
| 2006/0186353 | A1* | 8/2006 | Wassink | G03F 7/70858 250/492.2 |
| 2007/0228290 | A1* | 10/2007 | Wildenberg | G03F 7/70916 250/492.2 |
| 2009/0272917 | A1* | 11/2009 | Soer | G03F 7/70916 250/492.1 |
| 2010/0193712 | A1* | 8/2010 | Tawarayama | G03F 7/70033 250/504 R |
| 2010/0259733 | A1* | 10/2010 | Franken | B82Y 10/00 355/30 |

FOREIGN PATENT DOCUMENTS

| | | |
|---|---|---|
| JP | 2004-214656 A | 7/2004 |
| JP | 2007-505460 A | 3/2007 |
| JP | 2012-513653 A | 6/2012 |

\* cited by examiner

ENLARGED PART B

A-A CROSS SECTION

VIEWED FROM ARROW A DIRECTION

CENTER SUPPORT OF CIRCULAR
TRANCATED CONE SHAPE

FIG. 6B1

CENTER SUPPORT OF COMBINED SHAPE OF
CIRCULAR TRANCATED CONE AND CYLINDER

FIG. 6B2

CENTER SUPPORT OF CYLINDRICAL SHAPE

FOIL TRAP AND LIGHT SOURCE DEVICE USING SUCH FOIL TRAP

FIELD OF THE INVENTION

The present invention relates to a foil trap that is capable of protecting a light condenser mirror or the like from a debris emitted from a high temperature plasma as an extreme ultraviolet light source, and to a light source apparatus that uses the foil trap.

DESCRIPTION OF THE RELATED ART

As a semiconductor integrated circuit is being miniaturized and highly integrated, the wavelength of a light source for the exposure becomes shorter and shorter. As a next generation of a light source for exposing the semiconductor, the extreme ultra violet light source apparatus for emitting Extreme Ultra Violet light (hereinafter also referred to as "EUV") having the wavelength of 13.5 nm (hereinafter also referred to as "EUV light source apparatus") has been under development.

Several methods for generating the EUV light have been known in relation to the EUV light source apparatus. Amongst them, one method is known that heats and excites an extreme ultra violet light emitting species (hereinafter referred to as "EUV emitting species") to generate the high temperature plasma, and extracts the EUV light from the high temperature plasma.

The EUV light source apparatuses employing the above kind of method generally fall into a Laser Produced Plasma (hereinafter referred to as "LPP") type EUV light source apparatus and a Discharge Produced Plasma (hereinafter referred to as "DPP") type EUV light source apparatus.
(DPP Type EUV Light Source Apparatus)

FIG. 12 illustrates the DPP type EUV light source apparatus disclosed in Japanese Translation of PCT International Application Publication No. 2007-505460A (Patent Literature 1) in a simplified manner.

The EUV light source apparatus disclosed has a chamber 1 as a discharge vessel. The chamber 1 is provided with a discharge unit 1a and an EUV light condensing unit 1b. The discharge unit 1a accommodates a pair of discharge electrodes 2a and 2b and the like of a disk shape. The EUV light condensing unit 1b accommodates a foil trap 5 and an EUV light condenser mirror 9, which serves as light condensing optical means, and the like.

A gas exhausting unit 1c exhausts the discharge unit 1a and the EUV light condensing unit 1b in order to keep inside the chamber 1 in a vacuum state.

Reference signs 2a and 2b denote electrodes of the disk shape, respectively. The electrodes 2a and 2b are located apart from each other by a predetermined distance. The electrodes 2a and 2b rotate around rotary shafts 16c and 16d, which serve as rotation axes, respectively, with rotary motors 16a and 16b being rotated.

A reference sign 14 denotes a high temperature plasma raw material which emits the EUV light having the wavelength of 13.5 nm. The high temperature plasma raw material 14 is a heated and melted (molten) metal, for example, tin (Sn) in a liquid state, and is contained in containers 15a and 15b.

The above mentioned electrodes 2a and 2b are arranged such that the electrodes 2a and 2b are partially immersed in the containers 15a and 15b containing the high temperature plasma raw material 14, respectively. The high temperature plasma raw material 14 in the liquid state, which is mounted on surfaces of the electrodes 2a and 2b, respectively, is transported into a discharge space, with the electrodes 2a and 2b being rotated. A laser source 17a irradiates, with laser light 17, the high temperature plasma raw material 14 transported into the above mentioned discharge space. The high temperature plasma raw material 14 irradiated with the laser light 17 is then evaporated.

After the pulse voltage is applied to the electrodes 2a and 2b from a power supply unit 3, the high temperature plasma raw material 14 is evaporated by the irradiation with the laser light 17. Accordingly, a pulse discharge starts between the both electrodes 2a and 2b so that a plasma P is formed from the high temperature plasma raw material 14. When the plasma is heated and excited by a large (high) current flowing at the time of the discharge and then the plasma is raised up to the high temperature, the EUV light is emitted from the high temperature plasma P.

The EUV light emitted from the high temperature plasma P is condensed (or collected) at a light condensing point (or focusing point, also referred to as "intermediate focusing point") f of a light condenser mirror 9 by an EUV light condenser mirror 9, exits (is emitted) from an EUV light extracting unit 8, and then enters (is incident) into an exposure device 50 connected to the EUV light source apparatus, which is shown in a dashed line in FIG. 12.

The above mentioned EUV light condenser mirror 9 has in general a structure in which a plurality of thin concave mirrors are arranged to be nested with a high degree of accuracy. The particular shape of a reflecting plane of each of the concave mirrors may be, for example, an ellipsoid of revolution shape, a paraboloid of revolution shape, or a Walter type shape, and each of the concave mirrors has a solid of revolution (rotary body) shape. Here, the Walter type shape means a concave shape in which the light incident place (surface) thereof comprises, in turn from the light incident side, a hyperboloid of revolution and an ellipsoid of revolution, or otherwise the hyperboloid of revolution and a paraboloid of revolution.
(LPP Type EUV Light Source Apparatus)

FIG. 13 illustrates the LPP type EUV light source apparatus in a simplified manner.

The EUV light source apparatus of the LPP type has a light source chamber 1. The light source chamber 1 is provided with a raw material supply unit 10, which supplies a raw material as the EUV emitting species (that is, the high temperature plasma raw material), and a raw material supply nozzle 20. The raw material supply nozzle 20 injects, for example, tin (Sn) in the droplet as the raw material.

Inside the light source chamber 1 is maintained in a vacuum state by a gas exhausting unit 1c, which is constituted with a vacuum pump or the like.

The laser light (or laser beam) 22, which is emitted from an excitation laser light generating device 21 serving as a laser beam irradiating means, is introduced into the light source chamber 1 through a laser light incidence window 23 while being condensed by a laser light condensing unit 24, then passes through (transmits) a laser light transmitting window (passage hole) 25, and then irradiates the raw material injected from the raw material supply nozzle 20 (for example, tin in the droplet). The excitation laser light generating device 21, which is employed here, may be a pulse laser device having a cyclic (repetitive) frequency of several kHz, and a carbon dioxide gas ($CO_2$) laser or a YAG laser may be employed.

The raw material supplied from the raw material supply nozzle 20 is heated, excited and then becomes the high temperature plasma by irradiation with the laser light 22.

The high temperature plasma emits the EUV light. the emitted EUV light is reflected by an EUV condenser mirror 9 towards an EUV light extracting unit 8, condensed (collected) at a light condensing point (focusing point) (also referred to as "intermediate focusing point") of the EUV light condenser mirror 9, exits (is emitted) from an EUV light extracting unit 8, and then enters (is incident) into an exposure device 50 connected to the EUV light source apparatus, which is shown in a dashed line in FIG. 13.

Here, the EUV light condenser mirror 9 may be a reflection mirror having a spherical shape which is coated with, for example, a multi-layer film of molybdenum and silicon. The laser light transmitting window (hole) 25 may not be required depending on the arrangement of the excitation laser light generating device 21 and the laser light incidence window 23.

In some cases, the laser light 22 for generating the high temperature plasma may reach to, as stray light, the EUV light extracting unit 8. For this reason, a spectral purity filter, which is not illustrated in the figures, may be additionally arranged in front of the EUV light extracting unit 8 (that is, the high temperature plasma side) that allows the EUV light to transmit but prevents the laser light 22 from transmitting.

(Foil Trap)

In the above mentioned various EUV light source apparatuses, various kind of debris is generated from the high temperature plasma P. Such debris may be a debris of metal powder or the like which is generated with metal contacting the high temperature plasma P (for example, a pair of discharge electrodes of the disc shape 2a and 2b) being sputtered by the above mentioned plasma. Alternatively, the debris may be generated due to tin (Sn) as the high temperature plasma raw material 14.

Those kinds of debris acquire large kinetic energy via a contraction and expansion processes of the plasma.

In other words, the debris generated from the high temperature plasma P is an ion or a neutral atom that moves rapidly. The debris causes the reflection rate (reflectivity) to be lowered by butting the EUV light condenser mirror 9 to scrape the reflection plane thereof or by depositing onto the reflection plane thereof.

For this reason, in the EUV light source apparatus, a foil trap 5 is provided between the discharge unit 1a and the EUV light condenser mirror 9, which is accommodated in the EUV light condensing unit 1b, in order to prevent the EUV light condenser mirror 9 from being damaged. The foil trap 5 functions to trap or capture the above mentioned debris and to allow the EUV light only to transmit (pass through).

One example of the foil trap is disclosed in Japanese Translation of PCT International Application Publication No. 2002-504746A (Patent Literature 2) and Japanese Translation of PCT International Application Publication No. 2004-214656A (Patent Literature 3), latter of which discloses the "foil-trap".

FIG. 14 shows a schematic configuration of the foil trap as disclosed in the Patent Literature 2 (Japanese Translation of PCT International Application Publication No. 2002-504746A).

The foil trap 5 is configured with a plurality of thin films (foils) or thin flat plates (plates) (hereinafter collectively referred to as "foils 5a" in referring to the thin film or the flat plate), a center support 5b, and an outer ring 5c. The foils 5a are radially arranged in the radial direction with a center axis of the foil trap 5 (which is consonant with a light axis of the EUV light in FIG. 14) being a center. The center support 5b supports the plurality of foils 5a and is concentrically arranged with respect to the foils 5a. The outer ring 5c is a support body having a ring shape.

The foils 5a are arranged and supported such that the planar surfaces of the foils 5a are in parallel to the light axis of the EUV light. For this reason, when viewing the foil trap 5 from the extreme ultra violet light source (the high temperature plasma P) side, the thickness of the foil 5a is solely visible except for a part of the center support 5b and the outer ring 5c. As a result, the majority of the rays of the EUV light from the high temperature plasma P can transmit through the foil trap 5.

On the other hand, a plurality of foils 5a of the foil trap 5 functions (performs), by finely dividing the space in which the foils 5a are arranged, to decrease the conductance and to increase the pressure in a part of the space. For this reason, the speed of the debris from the high temperature plasma P is reduced because the collision probability increases in a region with increased pressure because of the foil trap 5. Some of the debris with reduced speed is trapped (captured) by the foil or the support body of the foil.

It should be noted that the DPP type EUV light source apparatus does not use, for the purpose of the exposure (lithographic exposure), light on the light axis (that is, the light emitted from the high temperature plasma P at the angle of 0 degree (emission angle of 0 degree)) and also light incident (entered) on the EUV mirror at the incidence angle less than the incidence angle on which the concave mirror located at the innermost side of the EUV light condenser mirror is capable of reflecting the light (hereinafter referred to as "minimum incidence angle"). Rather, it is preferable that the above two types of light is eliminated (do not exist). For this reason, in that regard, the presence of the center support 5b causes no problem. Rather, in some cases, the center support 5b is used to positively shield the light. It should be noted that the center support 5b has in general a cone shape, because the center support 5b is required to have the shape that shields the light with the incidence angle equal to or less than the minimum incidence angle, which is defined by the configuration of the EUV light condenser mirror. Thus, hereinafter the center support is also referred to as "cone".

It should be also noted that the foil trap undergoes the larger thermal load, because the foil trap is arranged adjacent to (in the vicinity of) the high temperature plasma. Accordingly, the foil or the cone constituting the foil trap is formed by the high heat resistance material such as molybdenum, tungsten, a molybdenum alloy or the like.

The above mentioned foil trap is mostly employed for the DPP type EUV light source apparatus. On the other hand, in the case of the LPP type EUV light source apparatus, the travelling direction of the debris is controlled by controlling the magnetic field to suppress the collision of the debris onto the EUV light condenser mirror, or otherwise the debris adhered to the EUV light condenser mirror is removed by a cleaning gas such as hydrogen gas or the like. However, as shown in FIG. 12, in some cases the above mentioned foil trap 5 may be arranged between the high temperature plasma P and the EUV light condenser (condensing) mirror 9. In other words, the foil trap may be employed not only in the DPP type EUV light source apparatus but also in the LPP type EUV light source apparatus.

(Rotational Type Foil Trap and Stationary Type Foil Trap)

In recent years, as disclosed in Japanese Translation of PCT International Application Publication No. 2012-513653A (Patent Literature 4), certain configuration has been known that is provided with two foil traps in series, one of which is rotated.

FIG. 15 illustrates a schematic configuration of such kind of foil traps. In an exemplary configuration in FIG. 15, a foil trap closer to the high temperature plasma P has a function to rotate. Hereinafter, one foil trap having a rotational (rotary) function is also referred to as a "rotational type foil trap", and the other foil trap of a stationary type without rotational function is also referred to as a "stationary type foil trap".

The rotational type foil trap 4 has a cone (center support) that is coaxially connected to a rotary driving shaft of a rotary driving mechanism, which is omitted in the figures. When the rotary driving shaft of the rotary driving mechanism rotates, then the above mentioned rotational type foil trap 4 is rotated around the rotary driving shaft of the cone (center support) 4c.

Each of foils of the rotational type foil trap 4 is fixed to the cone 4c, and each of the foils 4a extends radially from the rotary driving shaft. It should be noted that the rotational type foil trap 4 have only to be fixed to the cone 4c.

The rotational type foil trap 4 is configured to trap (capture) the debris drifting (flying) from the plasma, with a plurality of foils 4a being rotated around the rotary driving shaft of the cone 4c. For example, the debris due to tin (Sn), which is the high temperature plasma raw material 14, is trapped (captured) by the foils 4a of the rotational type foil trap 4, or otherwise is deflected such that the debris moves in the travelling direction different from the EUV mirror side. In other words, the rotational type foil trap 4 can prevent the debris from depositing on the respective concave mirrors of the EUV light condenser mirror 9 to some extent.

The stationary type foil trap 5 traps (captures) the debris that advances rapidly and cannot be fully trapped by the rotational type foil trap 4. Because the collision probability of the above mentioned debris increases in the area with an increased pressure by the stationary type foil trap 5, the speed (velocity) of the debris moving rapidly is reduced. Some of the debris with reduced speed may be trapped by the foils or the support body of the foils. In other words, the stationary type foil trap 5 can prevent the respective concave mirrors of the EUV light condenser mirror from being sputtered due to the high speed debris.

LISTING OF REFERENCES

Patent Literatures

Patent Literature 1: Japanese Patent Application Laid-Open Publication No. 2007-505460
Patent Literature 2: Japanese Patent Application Laid-Open Publication No. 2002-504746
Patent Literature 3: Japanese Patent Application Laid-Open Publication No. 2004-214656
Patent Literature 4: Japanese Patent Application Laid-Open Publication No. 2012-513653

SUMMARY OF THE INVENTION

Problems to be Solved by the Invention

In the meantime, conventionally, the conceptual aspects of the rotational type foil trap has been proposed in the literatures or the like, as a method of reducing debris for the EUV light source that uses, in particular, tin as the discharge raw material. However, when inventors of the present invention has fabricated the rotational type foil trap and used in the EUV light source apparatus, the inventors have confronted various problems to be solved in relation to, in particular, the reliability or the life duration.

More particularly, the rotational type foil trap operates under the condition being constantly exposed to a large thermal load from the plasma. Taking such condition into account, there have been problems in relation to the materials for the foil or the center support that is durable for the practical use, and also the structure of a joining part (joint) between the foil and the center support and joining method thereof. Inter alia, in relation to the rotational type foil trap, the centrifugal force is exerted to the foil as the foil is rotated. Thus, it is considered necessary to increase the tensile strength of the joint between the foil and the center support under the high temperature condition.

In the meantime, in relation to the stationary type foil trap disclosed in, for example, the Patent Literature 3 (Japanese Translation of PCT International Application Publication No. 2004-214656A), the foils (the thin films 31 and 32 of the foil trap 9 in the Patent Literature 3 (Japanese Translation of PCT International Application Publication No. 2004-214656A)) are retained with an inner ring 33 and an outer ring 35. The foils 31 and 32 and the outer ring 35 are fixed together by way of the soldering or the welding. On the other hand, the stationary type foil trap has a configuration in which the foils 31 and 32 and the inner ring 33 are connected such that an inner edge 62 having a recess 63 is merely inserted into a groove 51 provided at the inner ring 33.

However, when the above mentioned configuration is as-is applied to the rotational type foil trap, then it becomes difficult to obtain sufficiently larger tensile strength of the joint between the foil and the center support under the high temperature condition.

Next, when an input power to the plasma is equal to or greater than 10 kW, a problem has been observed that the transmission rate (transmissivity) of the EUV light of the rotational type foil trap is lowered. As a result of an investigation for a cause for such problem, it is turned out that in the foils constituting the rotational type foil trap a large temperature gradient occurs locally so that an elastic deformation, so called buckling, occurs.

Also, as the input power to the plasma increases, the thermal load that is input from the plasma to the rotational type foil trap also increases. As a result, another problem is observed that the temperature of the foils increases and molybdenum constituting the foil recrystallizes.

In addition, as will be described below, according to the present invention, the foil and the center support are brazed in order to increase the strength of the joint between the foil and the center support. In this configuration, however, yet another new problem is observed that, when the temperature of the foil increases, the brazing material joining the foil to the center support is deteriorated so that the life duration of the rotational type foil trap becomes shorten.

For this reason, in order to cope with the thermal load to the rotational type foil trap that increases as the input power increases, the rotational type foil trap is required to have a function to suppress the temperature increase of the foil.

The present invention has been made in view of the above mentioned circumstances and its object is to provide a rotational type foil trap that is capable of avoiding the transmission rate (permeability) of the EUV light to be lowered even when the EUV light source operates with the high input power and also suppressing the temperature increase of the foil to attain a sufficient life duration of the rotational type foil trap.

Solution to the Problem

As a result that the inventors of the present invention have earnestly been investigating, it has been found out and conceived that the rotational type foil trap with an configuration as the followings is capable of avoiding the transmission rate of the EUV light to be lowered even when the EUV light source operates with the high input power and also suppressing the temperature increase of the foil to attain a sufficient life duration of the rotational type foil trap.

More particularly, one end of each of foils is inserted into each of a plurality of grooves provided on a side face of a center support, and the foils are fixed to the center support by way of the brazing. With this configuration, it makes it possible to solidly and firmly fix the each of foils to the center support so that the sufficient life duration can be attained even when the EUV light source operates with high input power. It is turned out that gold brazing material (brazing filler material) is preferable for the brazing material used for the above fixture.

Also, with the center support being fabricated in a cylinder truncated conical (cone) shape, the temperature gradient is mitigated and the groove machining for attaching the foil is facilitated compared to the center support of the cylindrical shape.

Yet also, in the above mentioned configuration, it is turned out that a plate (board) thickness is preferably between 0.2 mm and 0.5 mm. With the plate thickness being within the above mentioned range, it makes it possible to avoid the foil to be deformed and also avoid the transmission rate (transmittance or permeability) of the EUV light to be lowered even when the temperature gradient of the foil becomes larger.

In addition, with the plate thickness (thickness) being within the above mentioned range, it also makes it possible to reduce the convoluted or additional load to a rotary driving shaft which rotary rotates the rotational type foil trap.

Yet furthermore, a channel passage with a dual (double) channel structure having an inner channel and an outer channel inside the above mentioned center support may be provided so as to allow fluid for heat exchange to flow in from one of the channel and flow out from the other of the channel. With this configuration, it makes it possible to maintain the foils to have the temperature that is equal to or greater than a melting point of the plasma raw material and equal to or less than an evaporating temperature of the plasma raw material, and that is equal to or less than the recrystallization temperature of the material constituting the foil. In addition, it makes it possible to prevent the brazing material from being deteriorated.

Yet furthermore, a covering member may be provided at an outer circumference (periphery) side of the rotational type foil trap that encloses a portion other than a light path of the EUV light. With this configuration, it makes it possible to recover the above mentioned fluid for the heat exchange by the covering member even if the fluid leaks. Also, it makes it possible to prevent the above mentioned fluid from contaminating inside the vacuum vessel for generating the plasma. In this regard, a gap between the foil trap and the covering member may be small. With this configuration, even when the center support of the rotational type foil trap is about to disengage (come off) from the rotary driving shaft thereof, the foil trap can contact the covering member and come to a stop. Thus, it makes it possible to prevent the foil trap from being dropped off.

Yet furthermore, the center support may be coupled to the rotary driving shaft with a thread (screw), an O-ring groove may be provided either at an end of the thread (threaded part) of the center support or an end of the thread of the rotary driving shaft, and an O-ring may be placed in the O-ring groove. With this configuration, it makes it possible to prevent the fluid from leaking from a fitting part between the center support of the rotational foil trap and the rotary driving shaft. In this case, a gap between an inner face of the above mentioned covering member and an end of the foil may be equal to or less than 30% of the diameter (of the O-ring) that is equivalent to a squeeze of the above mentioned O-ring. With this configuration, even when the above mentioned thread becomes loosened, it makes it possible to prevent the fluid for the heat exchange from leaking, because a gap generated between the center support and the rotary driving shaft becomes equal to or less than the squeeze of the above mentioned O-ring.

Yet furthermore, with the covering member being provided, it makes it possible to reduce the conductance in a gap between the foil trap and the covering member so that the debris emitted from the plasma is more likely to be trapped as well.

More particularly, according to the present embodiments of the present invention, a rotational type foil trap may be configured as will be described below, and a light source apparatus may be configured using the rotational type foil trap.

(1) According to one aspect of the present invention, there is provided a rotational type foil trap is arranged adjacent to a plasma that emits light and allows the light to transmit but traps a debris from the plasma. The rotational type foil trap comprises: a plurality of foils radially extending from a main shaft. The plurality of foils are supported by a center support arranged on the main shaft, and are configured to be capable of being rotated by a rotary mechanism coupled to the center support with the center support being a rotation axis. One end of each of the foils is inserted into each of a plurality of grooves provided on a side face of the center support, and the each of the foils is fixed to the center support by way of the brazing.

(2) According to another aspect of the present invention, gold brazing material may be employed as a brazing member or material for joining the foils and the center support.

(3) According to yet another aspect of the present invention, material constituting the foil or the center support may be any of molybdenum, tungsten, and an alloy containing molybdenum or tungsten.

(4) According to yet another aspect of the present invention, each of the foils may have a plate thickness (thickness) between 0.2 mm and 0.5 mm.

(5) According to yet another aspect of the present invention, the center support may have a circular truncated cone shape.

(6) According to yet another aspect of the present invention, a channel passage with a dual channel structure consisting of an inner channel and an outer channel may be provided inside the center support, and inside the channel passage fluid flows in from one of the channels and flows out from the other of the channels. The foils fixed to the center support may be maintained at the temperature that is equal to or greater than a melting point of the plasma raw material and equal to or less than an evaporating temperature of the plasma raw material, and that is equal to or less than a recrystallization temperature of a material constituting the foils.

(7) According to yet another aspect of the present invention, the fluid may be supplied to the channel passage with the dual channel structure such that the fluid flows in from an inlet port provided at the outer channel of the channel passage, through the outer channel and the inner channel in turn, and flows out from an outlet port provided at the inner channel. An inclined portion that inclines towards the outer channel side may be provided at an end of the inner channel into which the fluid, which has passed through the outer channel, flows in.

(8) According to yet another aspect of the present invention, the fluid may be water, and a coating consisting of a corrosion resistant material may be applied to a part contacting water supplied from the channel passage inside the central support.

(9) According to yet another aspect of the present invention, the corrosion resistant material may be nickel (Ni) or titanium nitride (TiN).

(10) According to yet another aspect of the present invention, a first thread may be provided along the rotation axis of the center support, and a second thread that is capable of fitting the first thread may be provided on the rotary driving shaft of the rotary mechanism, and the rotational type foil trap may be coupled to the rotary mechanism by fitting the first thread and the second thread together.

(11) According to yet another aspect of the present invention, a rotational direction of the rotational type foil trap may be opposite to a fastening direction of the first thread and the second thread.

(12) According to yet another aspect of the present invention, a loosening (looseness or slackness) preventive (prevention) mechanism may be provided at a fitting part of the first thread and the second thread.

(13) According to yet another aspect of the present invention, an O-ring groove may be provided at an end of the thread side of the center support or an end of the thread side of the rotary driving shaft, and an O-ring may be arranged or located in the O-ring groove. A covering member may be provided at an outer circumference side of the rotational type foil trap. The covering member may enclose a part other than a light path of the EUV light. A gap (clearance) between an inner face of the covering member and an end of the foil may be equal to or less than 30% of the diameter of the O-ring.

(14) According to yet another aspect of the present invention, a covering member may be provided at an outer circumference side of the rotational type foil trap. The covering member may enclose a part other than a light path of the EUV light. A gap (clearance) between an inner face of the covering member and an end of the foil may be equal to or less than 1.5 mm.

(15) Moreover, according to yet another aspect of the present invention, the rotational type foil trap according to the above mentioned embodiments may be applied to a light source apparatus comprising: a vessel; a plasma raw material supply unit for supplying a plasma raw material into the vessel; a discharge member composed of a pair of discharge electrodes for heating and exciting the plasma raw material to generate plasma; a light condenser mirror for condensing light emitted from the plasma; a foil trap provided between the discharge member and the light condenser mirror; a light extracting unit formed in the vessel for extracting the condensed light; and an exhausting unit for exhausting the vessel and regulating a pressure inside the vessel.

Moreover, according to the yet another aspect of the present invention, the rotational type foil trap according to the above mentioned embodiments may be applied to a light source apparatus comprising: a vessel; plasma raw material supply means for supplying a plasma raw material into the vessel; laser beam irradiating means for irradiating the plasma raw material with a laser beam and heating and exciting the plasma raw material to generate high temperature plasma; a light condenser mirror for condensing light emitted from the plasma; a foil trap provided between the high temperature plasma and the light condenser mirror; a light extracting unit formed in the vessel for extracting the condensed light; and an exhausting unit for exhausting the vessel and regulating a pressure inside the vessel.

Advantageous Effect of the Invention

According to the present embodiments of the present invention, the following advantageous effect is attainable.

(1) According to the foil trap of the present embodiments of the present invention, one end of each of the foils is inserted into each of a plurality of grooves provided on the side face of the central support, and the foils are fixed to the center support by way of the brazing (by brazing). As a result, the foils are more rigidly and firmly fixed to the center support compared to the structure, as disclosed in the Patent Literature 1 (Japanese Translation of PCT International Application Publication No. 2007-505460A), in which the inner edge of the foils is merely inserted into the groove provided on the inner ring.

Furthermore, the foils and/or the center support may be composed of a heat resistant material with lower expansion coefficient, such as any of molybdenum, tungsten, and an alloy containing molybdenum and/or tungsten. For this reason, the foils and the center support have a satisfactory heat resistance with respect to the thermal load that is undergone by the rotational type foil trap arranged adjacent to the plasma so that any defect such as the deformation is effectively suppressed. As a result, in the rotational type foil trap, no deficiency occurs that the amount (quantity) of light transmission from the plasma is unintentionally reduced due to the deformation of the rotational type foil trap.

In particular, with the gold brazing material being the brazing member or material, sufficient tensile strength can be attained at the brazed part, and the brazing material (brazed part) is unlikely to fuse with respect to the thermal load. It should be noted that when the inventors of the present invention has observed the foil composed of the high melting point material after brazing using the gold braze, it was confirmed that no recrystallization of the foils occurred.

(2) When the thickness of the foil itself is between 0.2 mm and 0.5 mm, the buckling of the foil is unlikely to occur, which is due to the temperature gradient generated on the foil by the thermal load from the plasma. As a result, the deformation of the foil can be suppressed so that no deficiency occurs that the light transmission rate (transmittance) of the rotational type foil trap is degraded (deteriorated).

In the meantime, when the thickness of the foil itself is equal to or less than 0.5 mm, the additional (convolutional) load exerted to the driving unit (driving mechanism) that rotates and drives the rotational type foil trap can be reduced. Moreover, because an area that shields the light by the foil itself becomes smaller, it makes it possible to ensure the light transmission rate in practice of the rotational type foil trap as well.

(3) In particular when the center support has circular truncated cone (conical) shape, it makes it possible to achieve larger volume or greater heat capacity, compared to the center support of cylindrical shape. As a result, the temperature gradient is also generated inside the center support. Thus, it makes it possible to mitigate the temperature gradient in the foil itself connected to the center support. Because the temperature gradient of the foil is mitigated, it makes it possible to prevent the buckling of the foil due to the temperature gradient from being generated.

Furthermore, the groove for inserting the foil is required to be machined (manufactured) on the side face of the center support. In this case, it is preferable that the depth of the groove is constant, in order to facilitate the supply of the brazing material and ensure the strength of the center support. When the groove for inserting the foil is machined (manufactured) on the side face of the center support, if the center support has a circular truncated cone shape, ridge lines of the side face lie on the same plane. As a result, one groove can be formed in one machining process.

On the other hand, if the center support has a combined shape consisting of a circular truncated cone shape at an upper side and a cylindrical shape at a lower side, the ridge lines of the combined shape do not lie on the same place. For this reason, when machining the groove such that the depth of groove is constant, it is required to perform the machining process twice while adjusting the inclination of the center support.

In contrast, if the center support has a circular truncated cone shape, it is sufficient to perform the machining process just once for forming one groove so that it makes it possible to reduce the manufacturing cost.

(4) In the rotational type foil trap according to the present embodiment, a dual channel type channel passage may be provided consisting of an inner channel and an outer channel inside the center support, and the heat exchange can be performed between fluid, which flows in and flows out to or from the dual channel type channel passage, and the center support. Thus, it makes it possible to regulate the temperature of the center support. Because the foils are fixed to the center support by brazing, the heat conductivity therebetween is sufficient. By regulating the temperature of the center support, it makes it possible to regulate the temperature of each of the foils. In particular, when the temperature of each of the foils is maintained at the temperature that is equal to or greater than the melting point of the plasma raw material and equal to or less than the evaporating temperature, and that is equal to or less than the recrystallization temperature of the material constituting the foils, it makes it possible to sputter the plasma raw material adhered to the foil from the rotational type foil trap. Thus, because the above mentioned raw material does not evaporate, it makes it possible to suppress the contamination of the EUV light condenser mirror due to vaporized raw material. Also, because the material constituting the foil itself does not recrystallize, the strength of the foil is not likely to be lowered.

(5) In particular, in the dual channel type channel passage, the fluid is supplied such that the fluid flows in from an inlet port provided at the outer channel of the channel passage, through the outer channel and the inner channel in turn, and flows out from an outlet port provided at the inner channel. When an inclined part is provided that inclines towards the outer channel side at an end of the inner channel into which the fluid, which has passed through the outer channel, flows in, it makes it possible to sufficiently supply the fluid to an inner corner of the outer channel. As a result, the center support can be efficiently cooled.

(6) In the meantime, when the fluid is water, if the coating with the corrosion resistant material such as nickel (Ni) or titanium nitride (TiN) is applied at a part contacting water supplied from the channel passage inside the center support, it makes it possible to suppress the corrosion inside the center support.

(7) When the foil trap has a configuration in which a first thread is provided along the rotation axis of the center support, a second thread, which is capable of fitting to the first thread, is provided on the rotary driving shaft of the rotary mechanism, and both threads fit to each other to couple the foil trap to the rotary mechanism, it makes it possible to relatively facilitate the attachment of the detachment. Moreover, with the thread diameter being larger, it makes it possible to increase (enhance) the tightening torque. Thus, even when the driving mechanism suddenly stops due to the failure or the like, the risk that rotational type foil trap comes off (disengages) becomes lower.

(8) In particular, when the rotational direction of the foil trap is opposite to the fastening direction of the first thread and the second thread, the torque, which is applied to the thread when the rotational type foil trap is accelerated (actuated), is exerted in the direction to fasten the both threads so that the both threads are coupled to each other rigidly and firmly.

(9) Furthermore, when a loosening (looseness) preventive mechanism is provided at a fitting part between the first thread and the second thread, it makes it possible to suppress the loosening of both of the threads and to couple the rotational type foil trap to the rotary mechanism more rigidly and firmly.

(10) When a covering member is provided at the outer circumference side of the rotational type foil trap that encloses a part other than the light path of the EUV light, even if the fluid to be used for regulating the temperature of the center support leaks, it makes it possible to recover the leaking fluid by the covering member. As a result, it makes it possible to efficiently prevent inside the vacuum vessel for generating the plasma from being contaminated by the fluid.

Furthermore, even if the coupling between the rotational type foil trap and the rotary driving unit is loosen, the rotational type foil trap contacts the covering member to come to a stop, thus the rotational type foil trap is prevented from falling into the vacuum vessel.

Furthermore, when an O-ring groove is provided at an end of the thread side of the rotary driving shaft or an end of the thread side of the center support, and an O-ring is arranged in the O-ring groove, it makes it possible to prevent the fluid from leaking from the fitting part between the center support and the rotary driving shaft of the rotational type foil trap.

In particular, when the gap (clearance) between an inner face of the covering member and the end of the foil is equal to or less than 30% of the diameter of the O-ring, it makes it possible to retain the status in which the O-ring contacts the center support and the rotary driving shaft even if the foil contacts the covering member and the rotational type foil trap stops. As a result, it makes it possible to reduce the amount (quantity) of the fluid for regulating the temperature that leaks from the fitting part between the center support and the rotary driving shaft.

(11) Yet furthermore, when the gap between the inner face of the covering member and the end of the foil is equal to or less than 1.5 mm, then the conductance is lowered (decreases) in the gap and the pressure raises (increases) in the gap. As a result, the debris emitted from the plasma is more likely to be trapped.

The above mentioned and other not explicitly mentioned objects, aspects and advantages of the present invention will become apparent to a skilled person from the following detailed description when read and understood in conjunction with the appended claims and drawings.

BRIEF DESCRIPTION OF THE DRAWINGS

FIG. 6B1 is a view showing another exemplary shape of the center support;

FIG. 6B2 is a cross sectional view intersected by a plane including the center axis of the center support shown in FIG. 6B1;

DETAILED DESCRIPTION OF THE INVENTION (Basic Configuration of the Rotational Type Foil Trap)

Figure 1A:
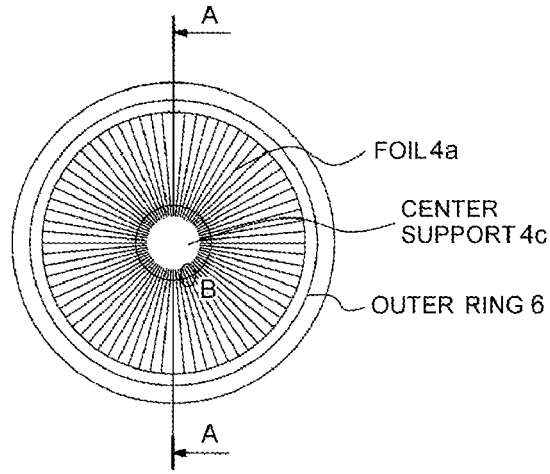
FIG. 1A is a view schematically showing an exemplary configuration according to one embodiment of the rotational type foil trap of the present invention.
Figure 1B:
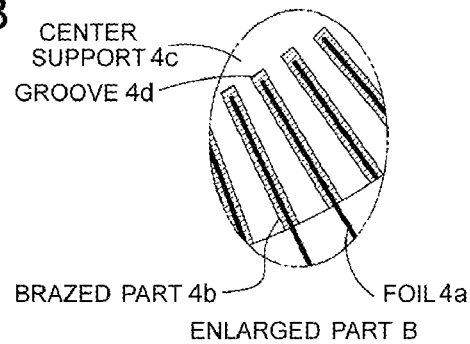
FIG. 1B is an enlarged view showing the part B shown in FIG. 1A.
Figure 1C:
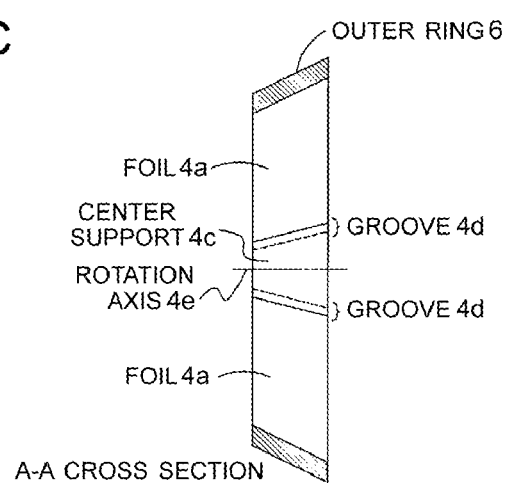
FIG. 1C is a cross sectional view along A-A shown in FIG. 1A.

FIGS. 1A to 1C are views showing an exemplary configuration of a rotational type foil trap according to an embodiment of the present invention. According to the present embodiment of the rotational type foil trap, a plurality of foils $4a$ are fixed to a center support $4c$. As shown in FIG. 1C, the foils radially extend from a rotation axis $4e$ of the center support $4c$. In addition, an outer periphery (circumference) part of each of the foils $4a$ is connected to an outer ring 6, as shown in FIG. 1A. The outer ring 6 retains each of the foils such that a gap between respective foils $4a$ has an approximately equal distance one another. It should be noted that the "gap" herein means a gap (clearance) between adjacent portions or parts (of the foils) at each of the connecting parts between the outer ring 6 and the foil.

In the rotational type foil trap, the center support $4c$ is coaxially connected to a rotary driving shaft of a driving unit (in other words, a rotary driving mechanism), which is omitted in the figures. With this configuration being provided, when the rotary driving shaft of the driving unit rotates, then the rotational type foil trap is rotated (rotates) around the rotation axis $4e$ of the center support $4c$.

As shown in FIG. 1B, which is an enlarged view of a part B shown in FIG. 1A, a plurality of grooves $4d$ are formed into which the foils $4a$ are inserted, respectively, on a side face of the center support $4c$. As shown in FIGS. 1A and 1B, the foils $4a$ are inserted into the plurality of grooves $4d$, which are bored (formed) on the side face of the center support $4c$, respectively. Brazing material is filled between the groove $4d$ and the foil $4a$ so that each of the foils $4a$ and the center support $4c$ are joined by brazing (i.e., "a brazed part $4b$" as shown in FIG. 1B).

It should be noted that, when a width of the grove grooved (cut) on the center support $4c$ is excessively large with respect to the thickness of the foil $4a$, then the foil $4a$ is fixed to the center support $4c$ in a state that the foil $4a$ is inclined with respect to the ridge line of the center support $4c$ so as to cause the EUV light to be prevented from transmitting (passing through). Taking those into consideration, the width of the groove $4d$ is required to be slightly larger than the thickness of the foil $4a$.

(Brazing Material)

Material of the brazing to be used for the joining between the center support $4c$ and the foil $4a$ may be, for example, gold brazing material (gold braze or gold braze filling material). The property of the brazing material, which is required for an intended application for the rotational type foil trap, is the tension strength and the stability at high temperature. In the case of silver brazing material, the silver brazing material may fuse under the thermal load to which the rotational type foil trap is exposed, and the sustainable tension strength under the centrifugal force is not likely to be expected.

On the other hand, palladium braze and platinum brazing material have a sufficient heat resistance. However, when the foils $4a$ are brazed to the center support $4c$, the brazing temperature is required to be high over 1,000 degrees Celsius. In this regard, it is known that the high melting point material constituting the center support $4c$ or the foil $4a$, such as molybdenum, is likely to be brittle at the temperature equal to or greater than the recrystallization temperature as the recrystallization becomes advanced. For example, the recrystallization temperature of molybdenum is known as 800 to 1200 degree Celsius. For this reason, when palladium brazing material or platinum brazing material is employed as the brazing material, the recrystallization of the foil 4a is likely to be advanced. In consideration of the above, neither the palladium braze nor the platinum braze is suitable to be used as the brazing material.

It should be noted that, as the gold brazing material, Au—Ni based gold brazing material is preferable from the perspective of the workability of the brazing and the mechanical strength under the high temperature and the like.

(Material of Center Support and Foils)

As mentioned above, the material constituting the center support 4c and the foils 4a also affects a selection of the brazing material. The rotational type foil trap is close to the plasma so that the rotational type foil trap undergoes a large thermal load. For this reason, to constitute the center support 4c and the foils 4a, high melting point metal having the high heat resistance and the low expansion coefficient is used, such as molybdenum, tungsten, or an alloy containing those.

In particular, the center support 4c requires a complicated and precise machining process, such as cutting the groove for inserting the foil 4a. In this regard, pure molybdenum and pure tungsten are extremely brittle so that it is difficult to undergo the machining process. For this reason, it is preferable to employ alloy instead such as titanium-zirconium-molybdenum (TZM), which has relatively better workability.

As mentioned above, according to the foil trap of the present embodiment, one end of each of foils 4a is inserted into each of a plurality of grooves 4d arranged (provided) on a side face of the center support 4c, and the foils are fixed to the center support 4c by brazing. With this structure, it makes it possible to fix the foils 4a to the center support 4c more rigidly, compared to a structure in which an inner edge of the foil 4a is merely inserted into a groove provided on an inner ring, as disclosed in the Patent Literature 1 (Japanese Translation of PCT International Application Publication No. 2007-505460A).

Moreover, the foils 4a and/or the center support 4c are/is constituted from the material having the high heat resistance and low expansion coefficient, such as any of molybdenum, tungsten, and an alloy containing molybdenum and/or tungsten. For this reason, the foils 4a or the center support 4c has a sufficient heat resistance with respect to the thermal load which the rotational type foil trap arranged adjacent to the plasma undergoes so that any deficiency such as deformation or the like can be prevented from occurring.

As a result, in the rotational type foil trap, any deficiency hardly occurs that the passing amount (transmittance) of light from the plasma decreases due to the deformation of the rotational type foil trap.

In particular, as the gold brazing material is employed as the brazing material, it makes it possible to attain the sufficient tension strength at the brazed part. Also, the gold brazing material is unlikely to fuse under the thermal load exerted from the plasma. Moreover, no recrystallization of the foil 4a composed of the high melting point material is observed after the brazing so that the foil itself is unlikely to become brittle.

(Thickness (Plate Thickness) of Foil 4a)

The thickness of the foil 4a is required to be determined in consideration of the balancing of three points: an output from the EUV light source; a degree of the degradation of light (optical) transmittance (transmission rate) due to the buckling; and a degree of light transmittance of the foil trap because of the plate thickness.

As the thickness of the foil itself, that is, the volume of the foil 4a, increases, thermal capacity per one foil also increases. In other words, assuming the thermal input into the rotational type foil trap is constant, the attained (reached) temperature of the rotational type foil trap decreases, as the thickness of the foil 4a becomes thicker.

When the rotational type foil trap is used with the high (output) power type EUV light source in which an output power at the focusing (light condensing) point of the EUV light condenser mirror (also referred to as "IF output") exceeds 10 W (in other words, an input power into the plasma is equal to or greater than 10 kW), a large temperature gradient is generated on the foil so that the buckling is likely to occur due to the difference in the heat expansion on the same surface (plane). The light transmission rate (transmittance) of the EUV emitted from the plasma is lowered (decreases) in the rotational type foil trap due to the deformation of the foils 4a by the buckling. Here, as the plate thickness of the foil 4a becomes larger, the temperature of the foil 4a itself decreases so that the temperature gradient on the foil also becomes smaller. As such, as the plate thickness of the foil 4a becomes larger, the rigidity of the foil itself also increases so that the buckling is unlikely to occur. As a result, when the plate thickness (thickness) of the foil 4a becomes larger to some extent, it makes it possible to suppress the deficiency due to the buckling.

On the other hand, however, as the plate thickness of the foil 4a becomes larger, the weight of the foil trap itself also becomes larger. In particular, in the case of the rotational type foil trap, the load on the driving unit (the driving mechanism) increases to cause an adverse effect that, for example, the lifetime of a bearing, which rotatably supports the rotary driving shaft 41 of the driving unit, becomes shorter. As a matter of course, the light transmission rate (transmittance) of the rotational type foil trap also decreases as the plate thickness of the foil 4a becomes larger.

As a consequence, the thickness of the foil 4a is required to be set such that the foil has the resistance against the thermal load from the plasma to some extent and exerts less convolutional or additional load to the driving unit, and also the degradation in the light transmission rate (transmittance) of the EUV emitted from the plasma in the rotational type foil trap is allowed to be out of the question in practice.

As a result of an experiment carried out by the inventors of the present invention, it is turned out that the balance is optimal between the resistance against the high heat (thermal) input to the rotational type foil trap and the light transmission rate (transmittance) when the thickness of the foil 4a is within the range between 0.2 mm to 0.5 mm.

Figure 2A:
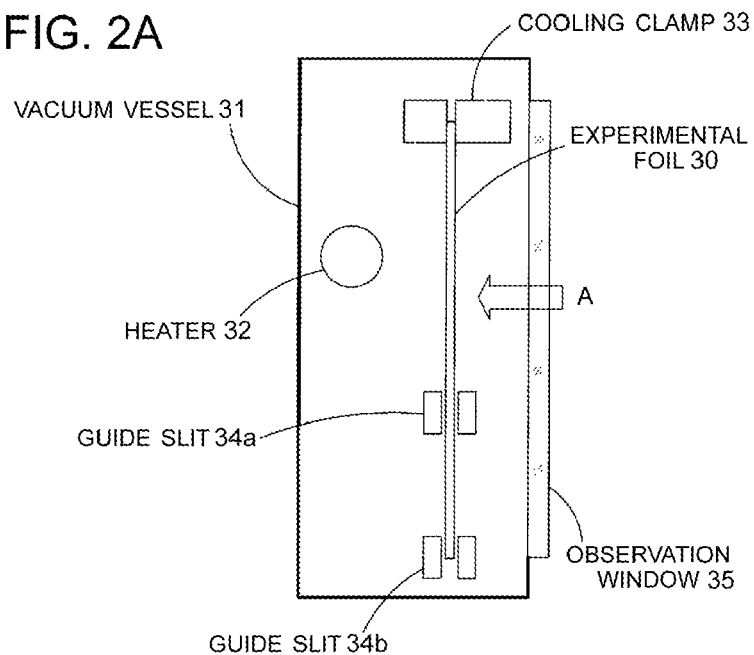
FIG. 2A is a view showing an experimental system for experimenting the degree of the buckling with respect to the locally measured foil temperature.
Figure 2B:
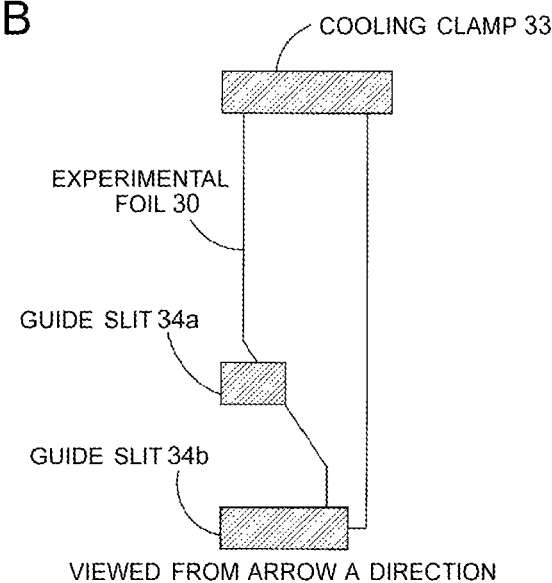
FIG. 2B is a view viewing from the arrow direction of A shown in FIG. 2A.

The inventors of the present invention first has experimented on the degree of the buckling with respect to locally measured temperature of the foil 4a. FIGS. 2A and 2B show an experimental system employed. FIG. 2A shows the experimental system as a whole, and FIG. 2B is a view viewing from an arrow direction of FIG. 2A. An experimental foil 30 having the same shape as the foil of the rotational type foil trap was employed. One end of the experimental foil trap is retained by a cooling clamp 33 which is cooled by a cooling unit, which is omitted in the figures. As shown in FIGS. 2A and 2B, the other end of the experimental foil 33 and an intermediate part (portion) between the one end and the other end of the experimental foil 33 are positioned, respectively, by guide slits 34a and 34b, which simulates (emulates) the outer ring 6 shown in FIG. 1A. A gap (interval) between the guide slits 34a and 34b is set larger than the plate thickness of the experimental foil 33. For this reason, it makes it possible for the experimental foil 3 to be positioned by the guide slits 34a and 34b to some extent even when the buckling occurs in the experimental foil 30 and the experimental foil 30 is deformed.

A heater 32 is arranged at a position opposing the experimental foil 30. As the heater 32, a halogen lamp with 150 W was employed. Moreover, in the EUV light source apparatus, the plasma and the rotational type foil trap are arranged in the chamber, and inside the chamber is maintained at the reduced pressure atmosphere. Thus, it means that the above mentioned experimental foil 30 and the heater and the like are arranged in a vacuum vessel as well. The pressure inside the vacuum vessel is, for example, $10^{-3}$ Pa.

Figure 3:
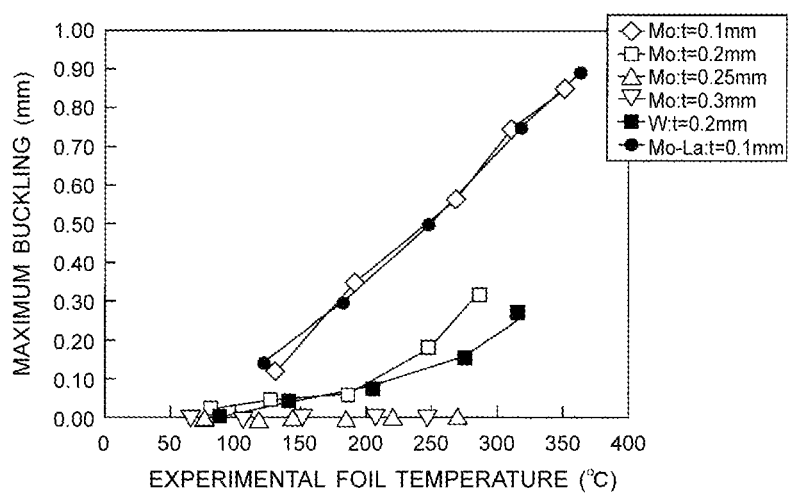
FIG. 3 is a chart showing the relationship of the maximum buckling with respect to the temperature of the experimental foil.

FIG. 3 shows the relationship of the maximum buckling with respect to the temperature of the experimental foil. In FIG. 3, the horizontal axis denotes the temperature of the experimental foil (degree Celsius) and the vertical axis denotes the maximum buckling amount (mm). As the experimental foil 30, a material composed of molybdenum (Mo) having a thickness (t) of 0.1 mm, a material composed of molybdenum (Mo) having a thickness (t) of 0.2 mm, a material compose of molybdenum (Mo) having a thickness (t) of 0.25 mm, a material composed of molybdenum (Mo) having a thickness (t) of 0.3 mm, a material composed of tungsten (W) having a thickness (t) of 0.2 mm, and a material composed of lanthanum doped molybdenum (abbreviated as Mo—La) having a thickness (t) of 0.1 mm are used, respectively.

In FIG. 3, a rhombus (open rhombus or diamond) denotes the molybdenum one with the thickness of 0.1 mm, a square (open square) denotes the molybdenum one with the thickness of 0.2 mm, a triangle (open triangle) denotes the molybdenum one with the thickness of 0.25 mm, an inverted triangle (inverted open triangle) denotes the molybdenum one with the thickness of 0.3 mm, a filled square (black square) denotes the tungsten one with the thickness of 0.2 mm, and a filled circle (black circle) denotes the Mo—La one having the thickness of 0.1 mm, respectively.

The temperature of the experimental foil 30 was measured using the thermocouple. Here, measured location was a rear surface (face) of the foil 30 that is the nearest to the heater (the surface opposite to the surface to be heated). On the other hand, the maximum buckling was measured using a laser meter through an observation window 35 in the direction of arrow A in FIG. 2A.

As apparent from FIG. 3, in the case of the experimental foil 30 of molybdenum, when the thickness of the experimental foil 30 is 0.1 mm, as the temperature of the experimental foil 30 increases, the value of the maximum buckling also rapidly increases. Similar result is observed in the case of the experimental foil 30 of lanthanum doped molybdenum (Mo—La).

On the other hand, in the case of the experimental foil 30 of molybdenum, when the thickness of the experimental foil 30 is 0.2 mm, even if the temperature of the experimental foil 30 increases, the value of the maximum buckling does not substantially increase. Similar result is observed in the case of the experimental foil 30 of tungsten.

Furthermore, in the case of the experimental foil 30 of molybdenum, when the thickness of the experimental foil 30 is either 0.25 mm or 0.3 mm, no matter how the temperature of the experimental foil 30 increases, the buckling itself does not occur.

As apparent from the above mentioned results, it is turned out that, when the plate thickness of the foil 4a constituting the rotational type foil trap is equal to or greater than 0.2 mm, the harmful influence (adverse effect) of the above mentioned buckling can be suppressed.

Next, comparison is carried out between the EUV output after the EUV has transmitted (passed through) the focusing point (light condensing point) (intermediate focusing point: IF) of the EUV light condenser mirror when the rotational type foil trap having the foil 4a of the thickness of 0.1 mm is mounted to the EUV light source apparatus, and the EUV output after the EUV has passed through the IF when the rotational type foil trap having the foil 4a of the thickness of 0.2 mm is mounted to the EUV light source apparatus.

Figure 4:
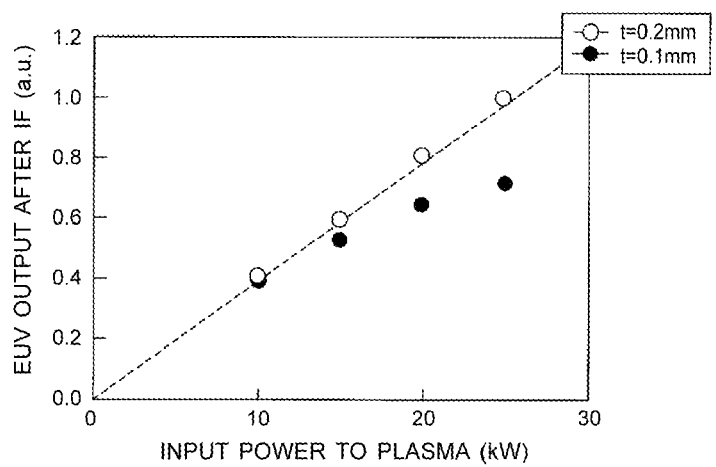
FIG. 4 is a chart showing the EUV output after the EUV light has transmitted through the focusing point (IF) of the EUV light condenser mirror in case that the rotary type foil trap having a foil with the plate thickness of 0.1 mm or a foil with the plate thickness of 0.2 mm, respectively.

FIG. 4 shows an experimental result. In FIG. 4, the horizontal axis denotes an input power (kW) into the plasma, and the vertical axis denotes the EUV output after passing through (transmission) the IF. It should be noted that a unit for the EUV output is an arbitrary unit (a. u.). Also, in FIG. 4, an open circle denotes the thickness of 0.2 mm and a filled circle denotes the thickness of 0.1 mm.

When the rotational type foil trap having the foil 4a with the thickness of 0.2 mm is used, the EUV output after passing through the IF linearly increases within the range of the input power into the plasma being between 10 kW and 25 kW. On the other hand, when the rotational type foil trap having the foil 4a with the thickness of 0.1 mm is used, the EUV output after passing through the IF is gradually saturated within the range of the input power into the plasma being between 10 kW and 25 kW.

In the case of the rotational foil trap having the foil 4a with the thickness of 0.1 mm, the reason why the above mentioned EUV output tends to be saturated is assumed that the buckling becomes greater as the input power into the plasma increases so that the light transmission rate (transmittance) of the rotational type foil trap gradually becomes lowered. This assumption confirms to the experimental result shown in FIG. 3 as well.

On the other hand, in the case of rotational foil trap having the foil 4a with the thickness of 0.2 mm, the reason why the above mentioned EUV output tends to linearly increase is assumed that no matter how the input power into the plasma increases, the buckling is sufficiently suppressed so that the light transmission rate (transmittance) of the rotational type foil trap does not substantially change.

As apparent from the above mentioned result, it is turned out that the thickness of the foil 4a composed of the high melting point metal, such as molybdenum, tungsten, or an alloy containing those (at least one of molybdenum and tungsten), is preferably equal to or greater than 0.2 mm.

Figure 5:
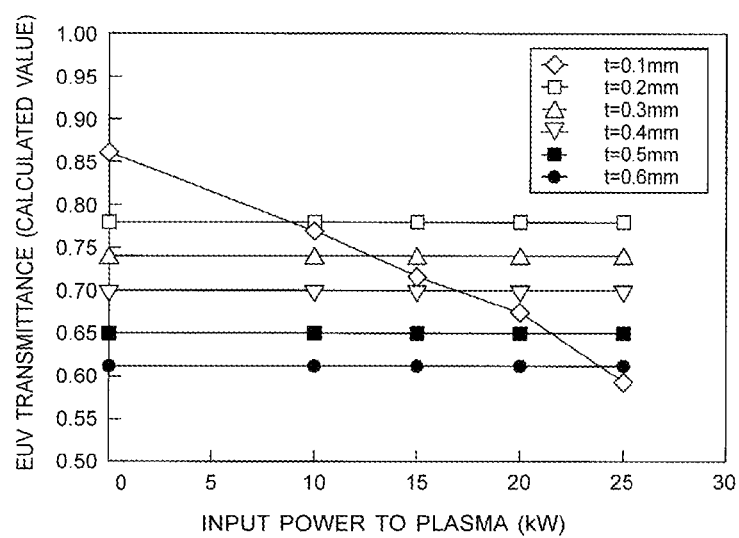
FIG. 5 is a chart showing the EUV transmittance (transmission rate) of the rotational type foil trap with the respect to the input power of the plasma, with the plate thickness t of the foil being the parameter.

FIG. 5 shows the EUV light transmittance (with the calculated value) in the rotational type foil trap with respect to the input power into the plasma (kW), with the thickness t of the foil 4a being a parameter. In FIG. 5, a rhombus (open rhombus or diamond) denotes the thickness (t) of 0.1 mm, a square (open square) denotes the thickness (t) of 0.2 mm, a triangle (open triangle) denotes the thickness (t) of 0.3 mm, an inverted triangle (inverted open triangle) denotes the thickness (t) of 0.4 mm, a filled square (black square) denotes the thickness (t) of 0.5 mm, and a filled circle (black circle) denotes the thickness (t) of 0.6 mm, respectively.

In the case of the rotational type foil trap with t=0.1 mm, the EUV light transmittance was actually measured after the input power into the plasma was regulated in a preliminary experiment such that the occurrence of the buckling is negligibly small. When the buckling does not occur, it is assumed that the light transmittance in the rotational type foil trap is not lowered. And an actual measured value of the light transmittance in this case is assumed to be the EUV light transmittance when the input power into the plasma is 0. The EUV light transmittance in this case was 89%.

After then, the comparison was carried out between a relationship of the input power into the plasma and the EUV output after passing through the IF when assuming that the buckling as shown in FIG. 4 does not occur and the light transmittance does not change and a relationship of the input power into the plasma and the EUV output after passing through the IF when t=0.1 mm. Subsequently, the EUV light transmittance (transmission rate) in the rotational type foil trap was back calculated and obtained based on the result of the above mentioned comparison and the above mentioned actual measured value.

In the case of the rotational type foil trap with t=0.2 mm, the EUV light transmittance is determined not to be lowered within the range of the input power into the plasma between 10 kW and 25 kW, because it is observed, from the result shown in FIG. 4, that the relationship between the input power into the plasma and the EUV output after passing through the IF is approximately linear. Thus, the EUV light transmittance was actually measured similarly to the case of t=0.1 mm, and the actual measured value was assumed to be the EUV light transmittance within the range of the input power into the plasma between 10 kW and 25 kW. The value thereof was 78%. It should be noted that in the case of the foil trap of either of t=0.3 mm, 0.4 mm, 0.5 mm, and 0.6 mm likewise, the EUV light transmittance was determined not to be lowered within the range of the input power into the plasma between 10 kW and 25 kW.

On the other hand, in the case of the rotational type foil trap with t=0.2 mm, the EUV light transmittance was obtained using the ray tracing method assuming the high temperature plasma being the light emitting point. Thus obtained EUV light transmittance was approximately 78%, which approximately coincided with the actual measured value of the EUV light transmittance. The result of calculation in the cases of t=0.3 mm, t=0.4 mm, t=0.5 mm, and t=0.6 mm were 74%, 70%, 65%, and 61%, respectively.

As mentioned above, in recent years, the EUV light source apparatus employs the rotational type foil trap and the stationary type foil trap arranged in series. For this reason, the EUV light transmittance as a whole of foil traps becomes smaller than the EUV light transmittance of the rotational type foil trap alone. In this regard, the EUV light transmittance as a whole of foil trap is desired to be, for example, equal to or greater than 60%. And in many cases, the EUV light transmittance of the rotational type foil trap alone is required to be equal to or greater than 65%. As a result, the thickness of the foil $4a$ of the rotational type foil trap is preferably equal to or less than 0.5 mm.

Moreover, as the thickness of the foil $4a$ of the rotational type foil trap becomes larger, the weight of the rotational type foil trap becomes greater. When the weight of the rotational type foil trap increases, the rotary driving mechanism for driving the rotational type foil trap is also required to be more extensive (larger). Roughly estimating the weight of the rotational type foil trap, the foil $4a$ with the thickness t=0.2 mm has 4 kg, the foil $4a$ with the thickness t=0.4 mm has 6.2 kg, and the foil $4a$ with the thickness t=0.6 mm has 8.4 kg, respectively. In consideration of the configuration of the rotary driving mechanism, according to the experiment conducted by the inventors of the present invention, it is turned out that the foil has preferably the thickness t equal to or less than 0.5 mm.

In light of the above observations, as mentioned above, it is preferable that the foil $4a$ made of the high melting point metal, containing molybdenum, tungsten, or the alloy of those metals, has the thickness equal to or greater than 0.2 mm and equal to or less than 0.5 mm. It should be noted that the above mentioned numerical range is based on the nominal thickness (or nominal designation of thickness) of the foil $4a$, and in practice the numerical range includes the tolerance of the thickness of the foil $4a$.

(Shape of Center Support $4c$)

Figure 6A:
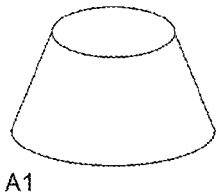
FIG. 6A is a view showing an exemplary shape of the center support.
Figure 6A:
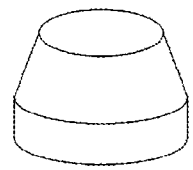
Figure 6A:
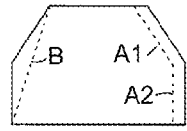
Figure 6C:
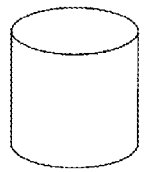
FIG. 6C is a view showing yet another exemplary shape of the center support.

The center support $4c$ is required to have a shape and an arrangement that does not interfere the light condensing (collecting) range of the light condenser mirror located behind the foil trap. FIGS. 6A to 6C shows an exemplary shape of the center support. More particularly, FIG. 6A shows an example of a circular truncated cone shape, FIGS. 6B1 and 6B2 show an example of a combined shape having an upper part of the circular truncated cone and a lower part of a cylinder. Likewise, FIG. 6C shows an example of a cylinder shape. It should be noted that FIG. 6B1 is a perspective view, and FIG. 6B2 is a cross sectional view taken by a place including a center axis of the center support.

As mentioned above, according to the rotational type foil trap of the present embodiment, a groove $4d$ is provided for inserting the foil on a side face of the center support $4c$. In this regard, when machining the groove, one machining process can only make the linearly cut groove having the same depth, even when any of practically available method is employed such as the laser machining or the discharge machining.

In the case of the combined shape as shown in FIGS. 6B1 and 6B2, the side face consists of a first side face of the circular truncated cone and a second side face of the cylinder so that the side face does not lie on the same plane. For this reason, in order to fabricate one groove on the side face of the center support having the combined shape, it is required to adjust the inclination of the center support $4c$ to retain the center support $4c$ such that the first side face of the circular truncated cone and the second side face of the cylinder coincide with the to-be-machined plane for the groove machining, respectively. In other words, as shown in the dashed lines A1 and A2, in FIG. 6B2, the machining process is required to be performed twice so that the fabrication (manufacturing) cost may increase.

In the meantime, in the shape shown in FIGS. 6B1 and 6B2, it may be also possible to machine the groove of the linear shape as shown in the dashed line B in FIG. 6B2 instead. However, in this case, the depth of the groove cannot be constant so that it makes it difficult to supply the brazing material into the deeper portion in the groove. Moreover, in order to allow the brazing material to fill between the groove and the foil, a considerable amount of brazing material is required, compared to the other shapes shown in FIGS. 6A and 6C. In addition, the alloy such as titanium-zirconium-molybdenum (TZM), which is the material to constitute the center support $4c$, is relatively brittle. Thus, making the deeper groove may entail the problem that the risk of the cracking may increase.

For this reason, it is preferable that the ridge line of the side face of the center support lies on the same plane, such as the shape of the center support shown in FIGS. 6A and 6C.

In the meantime, the shape of the center support may also affect the temperature distribution on the foil face (surface). In particular, when the center support portion has the circular truncated cone shape as shown in FIG. 6A, the volume of the center support increases compared to the cylinder shape shown in FIG. 6C so that it may achieve an advantageous effect that the heat capacity also increases. In this regard, according to a result of the simulation conducted, in the shape shown in FIG. 6A, it is confirmed that the temperature gradient is mitigated, and the buckling is less likely to occur.

As a result, for the shape of the center support 4c, it is preferable to have the circular truncated cone shape as shown in FIG. 6A, from the perspective of the manufacturing cost of the groove 4d on the side face and the heat capacity.

(Temperature Regulation of Foil 4a (Temperature Regulating Mechanism of Center Support 4c))

In the rotational type foil trap, tin (the debris), which is the high temperature plasma raw material drifting from the plasma, is trapped (captured) by the rotating foils 4a. At that moment, when the foil 4a is maintained at the temperature that is equal to or greater than the melting point of tin (i.e., equal to or greater than 235 degrees Celsius), the trapped tin becomes in the liquid form on the foil so that the liquid tin (debris) is sputtered outside the rotational type foil trap by the centrifugal force of the rotational type foil trap. Thus, it hardly occurs that tin deposits on the rotational type foil trap to prevent the EUV light from transmitting (passing through).

On the other hand, however, when the foil 4a is at the temperature equal to or greater than the evaporating temperature of tin (i.e., approximately 1,200 degrees Celsius), tin evaporates on the foil 4a to possibly contaminate the EUV light condenser mirror. As a result, it is preferable to regulate the temperature of the foil 4a to be equal to or greater than the melting point of tin, and equal to or less than the evaporating temperature of tin.

Yet on the other hand, the rotational type foil trap is heated by the fast particle such as an electron or on or the like, which is emitted from the plasma as the generation source of the EUV light, or by the radiation. Thus, the temperature of the foil 4a increases, as the input power input into the plasma increases. In other words, the rotational type foil trap undergoes the thermal load from the plasma.

In this regard, it is observed that, when the temperature of the foil 4a reaches at the high temperature equal to or greater than the recrystallization temperature of the material constituting the foil 4a, the material constituting the foil 4a starts to recrystallize so that the strength of the material becomes lower. Because the centrifugal force is constantly exerted to the rotating foil 4a, when the strength of the foil itself is lowered, it entails the possibility that the foil 4a may be damaged or broken. Thus, it is required to avoid the foil 4a to be recrystallized.

For this reason, it is preferable to regulate the temperature of the foil 4a such that the foil 4a is at the temperature that is equal to or greater than the melting point of tin and equal to or less than the evaporating temperature of tin, and that is equal to or less than the recrystallization temperature of the material constituting the foil 4a. For example, when molybdenum is employed as the material constituting the foil 4a, it is preferable to maintain the foil 4a to be at the temperature within the range between 235 degrees Celsius and 800 degrees Celsius, because the crystallization temperature of molybdenum is between 800 degrees Celsius and 1,200 degrees Celsius, the evaporating temperature of tin is approximately 1,200 degrees Celsius, and the melting point of tin is approximately 235 degrees Celsius.

Figure 7A:
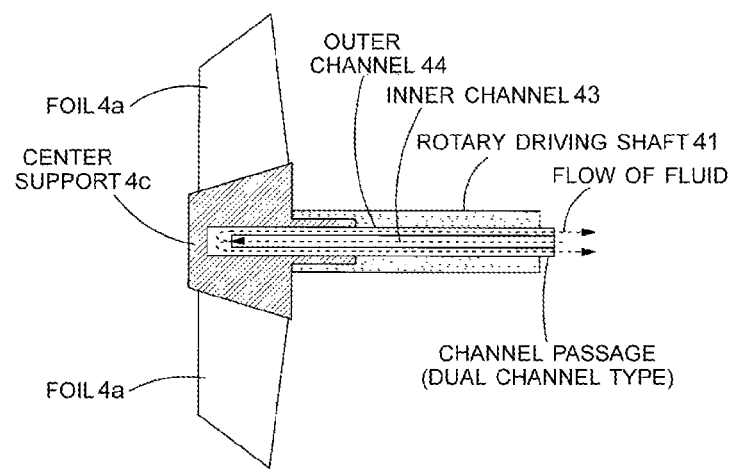
FIG. 7A is a view showing an exemplary configuration of the rotational type foil trap having a temperature regulating mechanism for regulating the temperature of the foils.
Figure 7B:
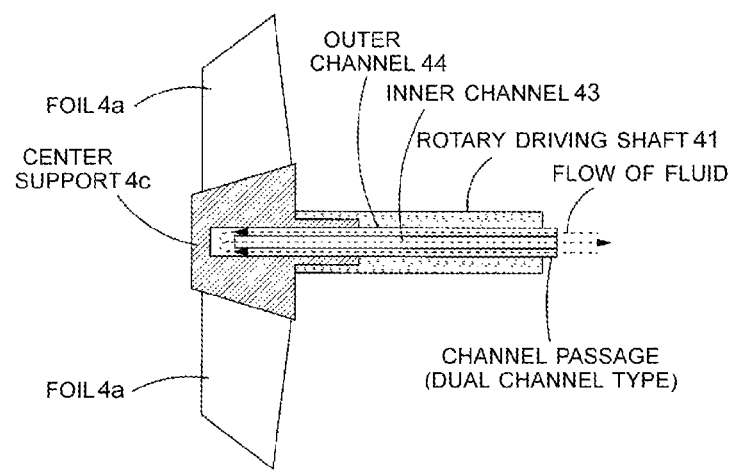
FIG. 7B is a view showing an exemplary configuration of the rotational type foil trap having a temperature regulating mechanism for regulating the temperature of the foils.

FIGS. 7A and 7B show an exemplary configuration of the rotational type foil trap including the temperature regulating mechanism for regulating the temperature of the foils 4a.

The center support 4c is coaxially connected to the rotary driving shaft 41 of the driving unit (rotary driving mechanism), which is omitted from the drawings. Inside the rotary driving shaft 41 and the center support 4c, a dual channel type channel passage 42, which is composed of an inner channel 43 and an outer channel 44, is provided. Then, it allows fluid to flow in from one channel (the inner channel 43 in FIG. 7A) and flow out from the other channel (the outer channel 44 in FIG. 7A). By doing this, the heat exchange occurs between the fluid supplied from the inner channel 42 of the center support 4c and the center support 4c so as to regulate the temperature of the center support 4c.

It should be noted that FIG. 7A shows an example in which the fluid flows in from the inner channel 43 and flows out from the outer channel 44, and FIG. 7B shows another example in which the fluid flows in from the outer channel 44 and flows out from the inner channel 43. More particularly, in FIG. 7A, the fluid, which flows in from the inner channel 43, flows out from the inner channel 43 within the center support 4c and flows in into the outer channel 44. Likewise, in FIG. 7B, the fluid, which flows in from the outer channel 44, flows out from the outer channel 44 within the center support 4c and flows in into the inner channel 43.

As mentioned above, the center support 4c and the foils 4a are fixed each other by brazing. For this reason, the center support 4c and the foils of the present embodiment have the better heat conduction, compared to the structure in which the inner edge of the foil 4a is merely inserted into the groove provided on the inner ring, as disclosed in the Patent Literature 1 (Japanese Translation of PCT International Application Publication No 2007-505460A). Thus, with the temperature of the center support 4c being regulated, it makes it possible to regulate the temperature of the foils 4a fixed to the center support 4c in a simplified and easier manner.

In this regard, it is extremely difficult to measure the surface temperature of the foil in operation. Thus, it is also difficult to control the temperature of the center support 4c according to the measurement result of the temperature of the foils 4a in the closed loop. Therefore, instead, it is preferable to examine in advance per the input power input into the plasma whether tin deposits on the foil or not and whether tin is recrystallized or not so as to obtain the optimal temperature of the fluid flowing within the dual channel type channel passage 42. Then, it is preferable to regulate the temperature of the fluid by the open loop control depending on the input power value introduced (input) into the plasma.

As a result of the fluid simulation performed by the inventors of the present invention, it is turned out that the temperature of the center support 4c can be effectively regulated when the shape of an end of the inner channel 43 (that is, an end at the side of the center support) is inclined towards outside of the channel and the fluid flows in from the outer channel 44 and flows out from the inner channel 43.

Figure 8A:
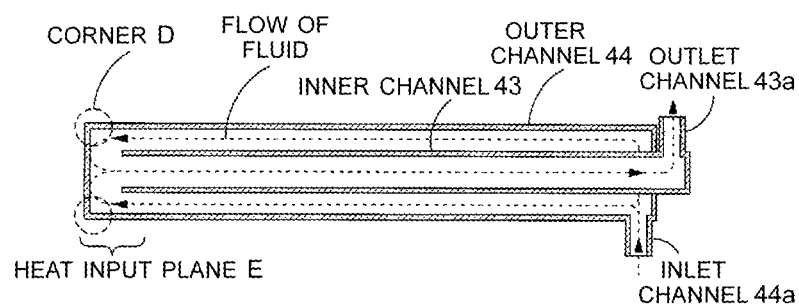
FIG. 8A is a view showing an exemplary configuration without an inclined part (portion) being provided at an end of the inner channel.
Figure 8B:
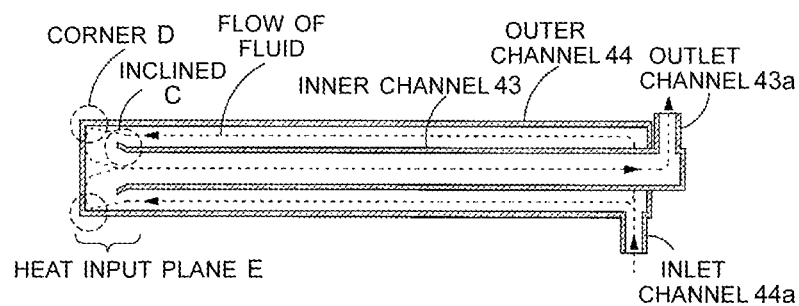
FIG. 8B is a view showing another exemplary configuration with an inclined portion being provided at the end of the inner channel.

FIGS. 8A and 8B show a model view (diagram) of the above configuration. More particularly, FIG. 8A shows the case of the end of the inner channel 43 without the inclined portion being provided, and FIG. 8B shows another case of the end of the inner channel 43 with the inclined portion being provided.

According to the exemplary configuration shown in FIGS. 8A and 8B, at the other end of the outer channel 44 (that is, an opposite end to the end at which the center support 4c is attached), an inlet channel 44a for supplying the fluid is provided. Likewise, at the other end of the inner channel 43 that is at the side of the inlet channel 44a, an outlet channel 43a for exhausting the fluid is provided.

The above mentioned simulation has been performed as follows.

A cooling pipe arrangement, which constitutes the dual channel type channel passage 42 consisting of the inner channel 43 and the outer channel 44, was made of stainless steel, and the physicality value of SUS304 was employed. Also, the piping length was 220 mm. The wall thickness of the both channel was 1.0 mm, the outer diameter of the outer channel 44 was 22.0 mm, and the outer diameter of the inner channel 43 was 14.5 mm, respectively, such that a cross section of the fluid flowing the outer channel 44 and a cross section of the fluid flowing the inner channel 43 coincide each other.

Moreover, in consideration that the center support side undergoes the high temperature, out of ends of the outer channel 44, the heat with the heat amount of 300 K was input to the end opposite to the side at which the inlet channel 44a is arranged (that is, a heat input surface side in FIGS. 8A and 8B).

The fluid employed was water, and the water flowed in from the inlet channel 55a at the temperature of 22 degree Celsius with the total pressure of 0.3 MPa. In this case, because the flow rate of the fluid was approximately 3 m/s, it was assumed that the heat transfer between the pipe arrangement and the cooling fluid was taken into account, but the momentum (motion quantity) of the fluid was not taken into account.

In the model shown in FIG. 8A, the comparison was carried out between the case in which the fluid is injected into the outer channel 44 from the inlet channel 44a, and, through the inner channel 43, exhausted from the outlet channel 43a (that is, the flow of fluid shown in FIG. 8A: hereinafter referred to as "case A") and the case in which the fluid is injected into the inner channel 43 from the outlet channel 43a, and, through the outer channel 44, exhausted from the inlet channel 44a (hereinafter referred to as "case B").

Calculating the temperature at the end of the heat input side of the outer channel 44, which corresponds to the side of the center support 4c, no substantial difference between the case A and the case B was observed.

On the other hand, with respect to the above mentioned case A, the model shown in FIG. 8A and the model shown in FIG. 8B was compared. In this case, the angle of the inclined part (portion) C provided at the end of the inner channel 43 shown in FIG. 8B was 10.5 degrees.

The temperature at the end of the heat input side of the outer channel 44 in the model shown in FIG. 8B was lower than the temperature in the model shown in FIG. 8A by approximately 40 K. It means that, when the fluid flows in from the outer channel 44 and flows out from the inner channel 43 for cooling, it is turned out effective to provide the inclined portion (part) C at the end of the inner channel 43.

The reason why the above mentioned difference in the advantageous effect was observed is assumed as the followings. In the model shown in FIG. 8A, the fluid is not sufficiently supplied to an inner corner D of the outer channel 44 at the side of the center support 4c to unintentionally generate the stagnation so that the end at the heat input side of the outer channel 44 is not sufficiently cooled. On the other hand, in the model shown in FIG. 8B, the fluid is effectively and sufficiently supplied to the above mentioned corner D by the inclined part (portion) C provided at the end of the inner channel 43 so that the end at the heat input side of the outer channel is sufficiently cooled.

In the meantime, with respect to the case A in which the fluid flows in from the inner channel 43 and flows out from the outer channel 44, the temperature at the end of the heat input side of the outer channel 44 in the model shown in FIG. 8B has no substantial difference from the temperature in the model shown in FIG. 8A. The reason thereof is assumed as the followings. The inclined part (portion) provided at the end of the inner channel does not substantially affect the flow of the fluid supplied from the inner channel 43 towards the inner side of the end at the heat input side of the outer channel 44 so that the supplied amount of the fluid to the above mentioned corner has no substantial difference between the models.

As a result, it is preferable to provide the inclined portion at the end of the inner channel 43 in the case that the fluid flows in from the outer channel 44 and flows out from the inner channel 43.

In the meantime, depending on a kind of the fluid used for regulating the temperature, a portion contacting the fluid inside the center support may corrode due to the reaction with the fluid (that is, the oxidation reaction). For example, when the medium constituting the fluid is water and the center support 4c is formed from molybdenum or molybdenum alloy, the center support 4c is corroded due to the oxidation reaction between water and molybdenum or molybdenum alloy constituting the center support 4c. In this case, a coating made of the corrosion resistant material such as nickel (Ni) or titanium nitride or the like may be applied to a portion (part) contacting the fluid inside the center support.

(Coupling Structure Between Center Support 4c and Rotary Driving Shaft 41)

Figure 9A:
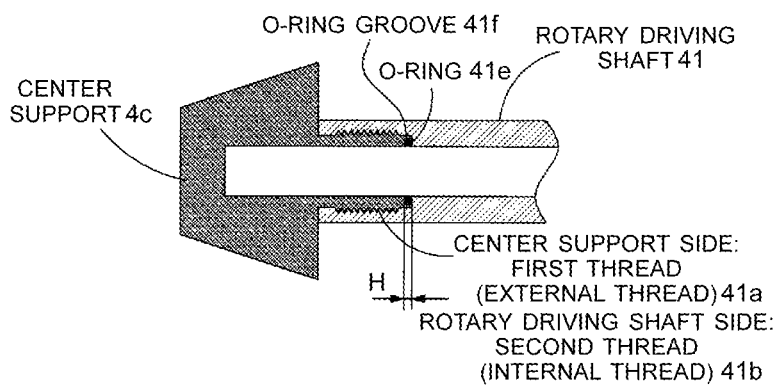
FIG. 9A is a view showing an exemplary configuration of a coupling part between the rotational type foil trap and the rotary driving mechanism.
Figure 9B:
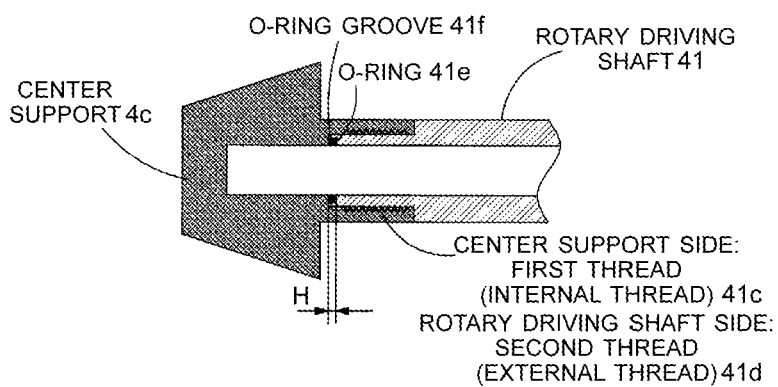
FIG. 9B is a view showing another exemplary configuration of a coupling part between the rotational type foil trap and the rotary driving mechanism.

As mentioned above, when the temperature is regulated by providing the flow channels inside the rotary driving shaft of the driving unit (rotary driving mechanism) and inside the center support of the rotational type foil trap, it is required to prevent the medium constituting the fluid from leaking inside the vessel (vacuum vessel) at the vacuum atmosphere for generating the plasma from the connecting portion (part) between the rotary driving mechanism and the rotational type foil trap (that is, the connecting portion between the above mentioned rotary driving shaft 41 and the above center support 4c). FIGS. 9A and 9B shown an exemplary configuration of the connecting portion with the screwed shape.

The rotational type foil trap is attached to the driving unit (rotary driving mechanism), which is omitted from the drawings, such that the rotational type foil trap is screwed in to the rotary driving shaft 41 of the rotary driving mechanism fixed by an exclusive or specialized tool or the like.

As shown in FIG. 9A, when an external thread, as a first thread 41a, is formed at the side of the rotational type foil trap (center support 4c), an internal thread, as a second thread 41b, is formed at the side of the rotary driving shaft and an O-ring groove 41f is provided at an end of the threaded side of the center support 4c.

On the other hand, when the internal thread, as a first thread 41c, is formed at the side of the rotational type foil trap (center support 4c), an external thread, as a second thread 41d, is formed at the side of the rotary driving shaft and the O-ring groove 41f is provided at an end of the threaded side of the rotary driving shaft 41. With an O-ring 41e being mounted to the above mentioned O-ring groove 41f, the fluid is prevented from leaking from the fitting portion between the center support 4c and the rotary driving shaft 41.

In this regard, the height H in the axis direction of the O-ring groove 41f is set such that the O-ring 41e crushes to some extent when the center support 4c is fitted into the rotary driving shaft 41. The crushing amount (hereinafter referred also to as "squeeze") in the axis direction of the O-ring 41e is determined such that the sealing function in the O-ring sealing portion is ensured. According to the present embodiment, the squeeze (crushing amount) of the O-ring 41e is approximately 30% of the diameter of the O-ring.

One of an advantageous effect of the above screw-in method is that, attaching and detaching are relatively easier because of the simplified shape of both parts. In addition, it is possible to increase the tightening torque by enlarging the thread diameter. Accordingly, even if the driving mechanism comes to a sudden stop due to the failure or the like, the risk is lower that the rotational type foil trap disengages due to the inertia.

In the case that the rotational type foil trap is connected to the rotary driving shaft 41 of the driving mechanism by the threaded method, it is preferable that the rotational direction of the rotational type foil trap is opposite to the fastening direction of the threads. For example, when the threads is the right handed thread (that is, fastened clockwise), it is preferable that the rotational direction of the foil trap is anticlockwise, seen from the plasma side. This is because the torque applied to the threaded portion (part)) at the time of acceleration (starting) of the rotational type foil trap exerts in the tightening direction of the threaded portion. Otherwise, when the direction is reversed, the torque is applied in the direction of loosening the threaded portion at the time of acceleration of the rotation. Accordingly, when the starting and stopping are repeated several times, then the risk increases that the foil trap disengages (comes off).

Figure 10:
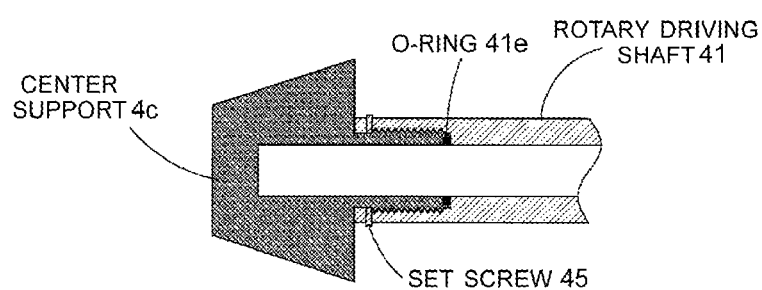
FIG. 10 is a view showing an exemplary configuration with a setting screw being provided at the rotary driving shaft side.

When the threaded portion is loosen and the fluid leaks, not only the vacuum vessel is contaminated but also an exhausting device connected to the vessel is likely to break down. The above situation has to be avoided absolutely. For this reason, it is preferable to heighten the reliability by adding a loosening preventive (prevention) mechanism to the connecting portion in the threaded shape. FIG. 10 shows an exemplary configuration in which a set screw 45 is provided at the rotary driving shaft side so as to reduce the possibility that the threaded portion of the rotational type foil trap is loosened.

Figure 11:
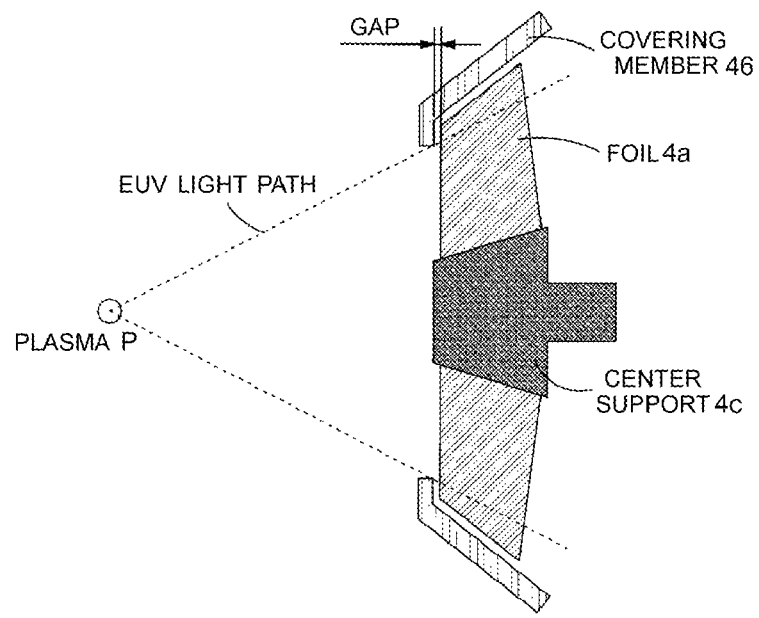
FIG. 11 is a view showing an exemplary configuration in which a covering member is provide at an outer circumference side of the rotational type foil trap that encloses apart other than the light path of the EUV light.
Figure 12:
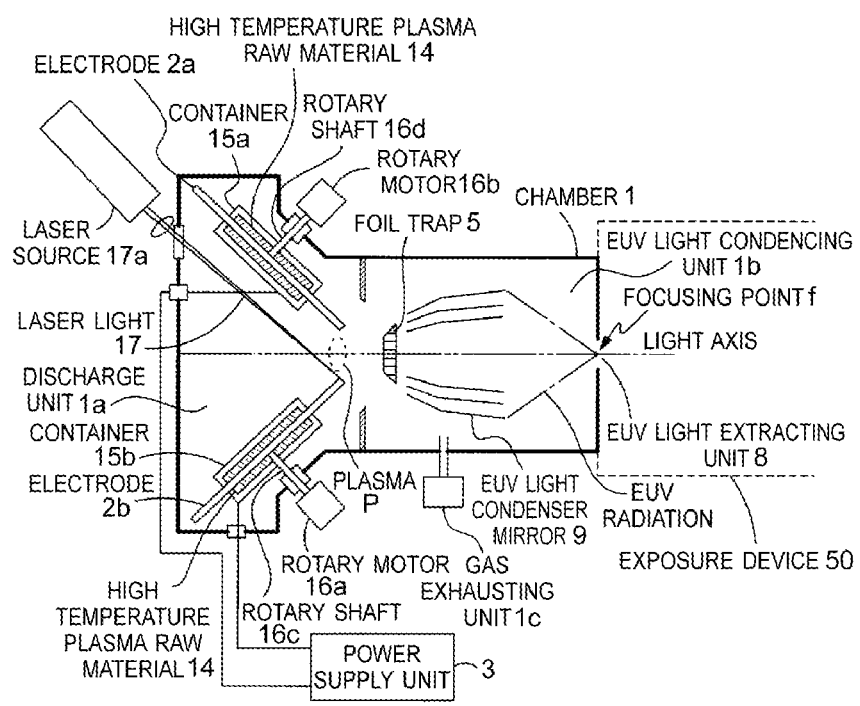
FIG. 12 is a view schematically showing an EUV light source apparatus of the DPP type.
Figure 13:
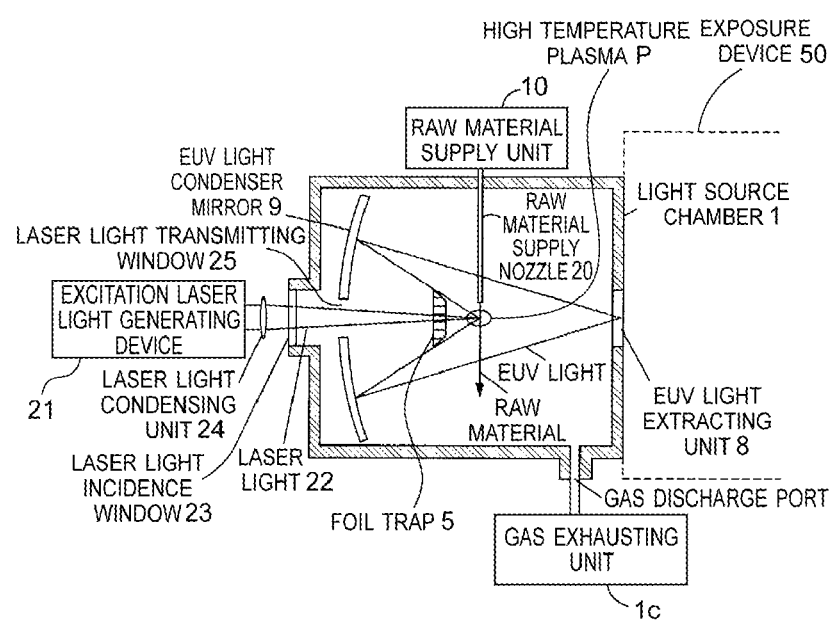
FIG. 13 is a view schematically showing the EUV light source apparatus of the LPP type.
Figure 14:
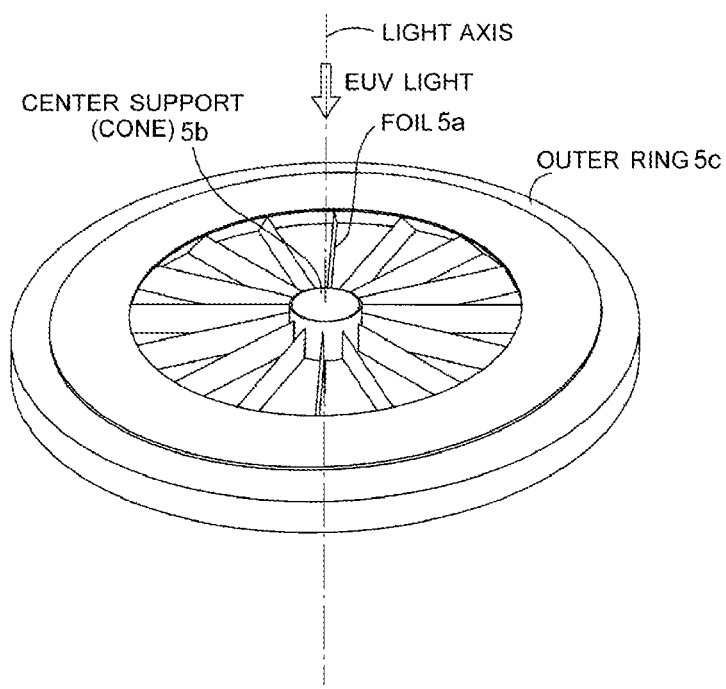
FIG. 14 is a view schematically showing an exemplary configuration of the foil trap.
Figure 15:
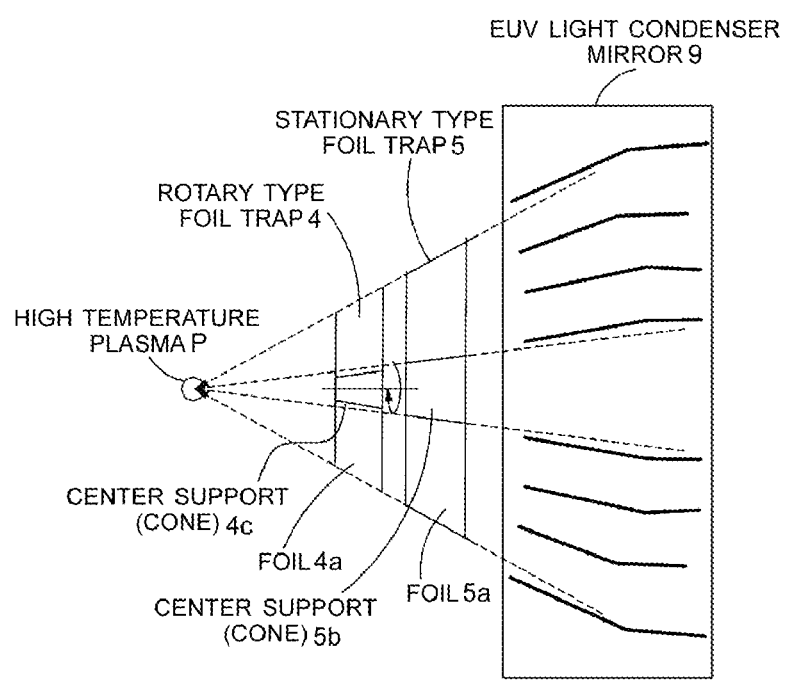
FIG. 15 is a view showing an exemplary configuration in which two foil traps are provided in series and one of the foil traps is configured to be rotated.

No matter how many countermeasure are accumulated, still it is conceivable that the rotational type foil trap may disengage from the rotary driving shaft 41 due to an inadvertent (unanticipated) accident or the like. In this regard, in order to minimize the leakage of the fluid for regulating the temperature when the treaded portion is loosened by any chance, as shown in FIG. 11, a covering member 46 is provided that is arranged at an outer periphery (circumferential) side of the rotational type foil trap and encloses a part other than the light path of the EUV light. With the covering member being provided, even if the fluid leaks, it makes it possible to recover the leaking fluid. Thus, inside the vacuum vessel can be prevented from being contaminated by the above mentioned fluid. In this regard, the function for trapping and recovering the debris sputtered from the rotational type foil trap may be added in conjunction with the covering member 46.

Here, preferably, the gap between the covering member 46 and the rotational type foil trap is equal to or less than 30% of the diameter of the O-ring.

When the rotational type foil trap disengages from the rotary driving shaft 41, the disengaged rotational type foil trap contacts the covering member 46 to come to a stop. At this point, if the gap between the rotational type foil trap and the covering member 46 is equal to or less than 30% of the diameter of the O-ring 41e, the squeeze (amount of crush) is greater than 0 and equal to or less than 30% of the diameter of the O-ring 41e. In other words, it makes it possible to reduce the amount of the fluid for regulating the temperature which leaks from the fitting portion between the center support 4c and the rotary driving shaft 41, because the state in which the O-ring 41e contact the center support 4c and the rotary driving shaft 41 is maintained.

Still in other words, conversely, if the gap between the rotational type foil trap and the covering member 46 is greater than 30% of the diameter of the O-ring 41e, the amount of leakage of the fluid increases, because the O-ring 41e only contacts either the center support 4c or the rotary driving shaft 41 or otherwise none of those.

It should be noted that when the gap between the rotational type foil trap and the covering member 46 becomes narrower, then the conductance in the gap decreases and the pressure therein increases. For this reason, the debris emitted from the plasma is more likely to be trapped. According to the results of the experiment carried out by the inventors of the present invention, it is turned out that, when the gap between the rotational type foil trap and the covering member 46 is equal to or less than 1.5 mm, the debris can be more effectively trapped by the rotational type foil trap.

While certain embodiments have been described, these embodiments have been presented by way of example only, and are not intended to limit the scope of the present invention. The novel apparatuses and methods thereof described herein may be embodied in a variety of other forms. Furthermore, various omissions, substitutions and modifications in the form of the apparatuses and methods thereof described herein may be made without departing from the gist of the present invention. The accompanying claims and their equivalents are intended to cover such forms or modifications as would fall within the scope and gist of the present invention.

The present application is based upon and claims the benefit of a priority from Japanese Patent Application No. 2013-184870, filed on Sep. 6, 2013, and the entire contents of which are incorporated herein by reference.

REFERENCE SIGNS LIST

1 Chamber
1a Discharge Unit
1b EUV Light Condensing Unit
1c Gas Exhausting Unit
2a, 2b Discharge Electrodes
3 Power Supply Unit
4 Rotational Type Foil Trap
4a Foil
4b Brazed Part
4c Conc (Center Support)
4d Groove
4e Rotation Axis
5 Stationary Type Foil Trap
8 EUV Light Extracting Unit
9 EUV Light Condenser Mirror
10 Raw Material Supply Unit
11 Foil Trap Cover
14 High Temperature Plasma Raw Material
15 Container
16a, 16b Rotary Motor
16c, 16d Rotary Driving Shaft
17 Laser Light
17a Laser Source
20 Raw Material Supply Nozzle
22 Laser Light
21 Excitation Laser Light Generating Device
22 Laser Light (Laser Beam)
23 Laser Light Incidence Window
24 Laser Light Condensing Unit 30 Experimental Foil
31 Vacuum Vessel
32 Heater
33 Cooling Clamp
34a, 34b Guide Slits
41 Rotary Driving Shaft
41a First Thread (External Thread)
41b Second Thread (Internal Thread)
41c First Thread (Internal Thread)
41d Second Thread (Internal Thread)
41e O-Ring
41f O-Ring Groove
42 Channel Passage (Pipeline)
43 Inner Channel
43a Outlet Channel
44 Outer Channel
44a Inlet Channel
45 Set Screw
46 Covering Member
50 Exposure Device
P High Temperature Plasma

What is claimed is:

1. A rotational type foil trap arranged adjacent to a plasma that emits light, for allowing the light to transmit but trapping a debris from the plasma, comprising:
a rotation axis;
a rotary mechanism configured to rotate the rotation axis;
a plurality of foils radially extending from a main shaft, the plurality of foils being supported by a center support arranged on the main shaft and configured to be capable of being rotated by the rotary mechanism coupled to the center support with the center support being the rotation axis; and
a plurality of grooves on a side face of the center support, each of the grooves being filled with a brazing material, one end of each of the foils being inserted into each of the grooves to be joined to the each of the grooves of the center support,
the center support and each of the foils being fixed by brazing, and
the brazing material having a brazing temperature less than recrystallization temperature of a material of the center support and the foils.

2. The rotational type foil trap according to claim 1, wherein gold brazing material is employed as a brazing member used for the brazing.

3. The rotational type foil trap according to claim 1, wherein material constituting the foils and the center support is any of molybdenum, tungsten, and an alloy containing molybdenum or tungsten.

4. The rotational type foil trap according to claim 3, wherein a thickness of each of the foils is within a range between 0.2 mm and 0.5 mm.

5. The rotational type foil trap according to claim 1, wherein the center support has a shape of a circular truncated cone.

6. The rotational type foil trap according to claim 1, further comprising:
A channel passage with a dual channel structure consisting of an inner channel and an outer channel inside the center support, wherein
fluid flows in from one of channels and flows out from the other of channels, and
each of foils fixed to the center support is maintained at a temperature that is equal to or greater than a melting point of raw material of the plasma and equal to or less than evaporating temperature of the raw material of the plasma, and that is equal to or less than recrystallization temperature of a material constituting the foil.

7. The rotational type foil trap according to claim 6, wherein
the fluid is supplied to the channel passage with the dual channel structure such that the fluid flows in from an inlet port provided at the outer channel of the channel passage, through the outer channel and the inner channel in turn, and flows out from an outlet port provided at the inner channel,
and further comprising:
an inclined portion inclined towards a side of outer channel at an end of a side of inner channel into which the fluid, which has passed through the outer channel, flows in.

8. The rotational type foil trap according to claim 6, wherein the fluid is water, and
a coating consisting of a corrosion resistant material is applied to a part contacting the water supplied from the channel passage inside the center support.

9. The rotational type foil trap according to claim 8, wherein the corrosion resistant material is nickel (Ni) or titanium nitride (TiN).

10. The rotational type foil trap according to claim 1, further comprising:
a first thread provided along the rotation axis of the center support, and a second thread capable of fitting to the first thread, the second thread being provided on a rotary driving shaft of the rotary mechanism, and wherein
the rotational type foil trap is coupled to the rotary mechanism by fitting the first thread to the second thread together.

11. The rotational type foil trap according to claim 10, wherein a rotational direction of the rotational type foil trap is opposite to a fastening direction of the first thread and the second thread.

12. The rotational type foil trap according to claim 10, further comprising:
A loosening preventive mechanism provided at a fitting portion between the first thread and the second thread.

13. The rotational type foil trap according to claim 10, wherein
an O-ring groove is provided at either an end of the thread side of the center support or an end of the thread side of the rotary driving shaft,
an O-ring is arranged in the O-ring groove,
a covering member is provided at an outer circumference side of the rotational type foil trap for enclosing a part other than a light path of EUV light, and
a gap between an inner face of the covering member and an end of the foil is set equal to or less than 30% of a diameter of the O-ring.

14. The rotational type foil trap according to claim 10, wherein
a covering member is provided at an outer circumference side of the rotational type foil trap for enclosing a part other than a light path of EUV light, and
a gap between an inner face of the covering member and an end of the foil is set equal to or less than 1.5 mm.

15. A light source apparatus comprising:
a vessel;
a plasma raw material supply unit for supplying a plasma raw material into the vessel;
a discharge member consisting of a pair of discharge electrodes for heating and exciting the plasma raw material to generate a plasma;

a light condenser mirror for condensing light emitted from the plasma;

a foil trap provided between the discharge member and the light condenser mirror;

a light extracting unit formed in the vessel for extracting the condensed light; and an exhausting unit for exhausting inside the vessel and regulating a pressure inside the vessel, wherein the foil trap is the rotational type foil trap according to claim 1.

16. A light source apparatus comprising:

a vessel;

a plasma raw material supply unit for supplying a plasma raw material into the vessel;

a laser beam irradiating unit for irradiating the plasma raw material with a laser beam, heating and exciting the plasma raw material to generate a high temperature plasma;

a light condenser mirror for condensing light emitted from the plasma;

a foil trap provided between the high temperature plasma and the light condenser mirror;

a light extracting unit formed in the vessel for extracting the condensed light; and an exhausting unit for exhausting inside the vessel and regulating a pressure inside the vessel, wherein the foil trap is the rotational type foil trap according to claim 1.

* * * * *